United States Patent
Ooishi et al.

(10) Patent No.: US 6,757,191 B2
(45) Date of Patent: Jun. 29, 2004

(54) THIN FILM MAGNETIC MEMORY DEVICE SHARING AN ACCESS ELEMENT BY A PLURALITY OF MEMORY CELLS

(75) Inventors: Tsukasa Ooishi, Hyogo (JP); Hideto Hidaka, Hyogo (JP); Masatoshi Ishikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/222,793

(22) Filed: Aug. 19, 2002

(65) Prior Publication Data

US 2003/0058686 A1 Mar. 27, 2003

(30) Foreign Application Priority Data

Sep. 21, 2001 (JP) ........................................ 2001-288825

(51) Int. Cl.$^7$ ................................................ G11C 11/14
(52) U.S. Cl. .................................. 365/171; 365/230.07
(58) Field of Search .............................. 365/171, 230.07

(56) References Cited

U.S. PATENT DOCUMENTS

| | | | |
|---|---|---|---|
| 5,793,697 A | 8/1998 | Scheuerlein | 365/230.07 |
| 6,191,972 B1 | 2/2001 | Miura et al. | 365/171 |
| 6,236,611 B1 * | 5/2001 | Naji | 365/226 |

OTHER PUBLICATIONS

Scheuerlein et al., "A 10ns Read and Write Non–Volatile Memory Array Using a Magnetic Tunnel Junction and FBT Switch in Each Cell", ISSCC Digest of Technical Papers, TA7.2, Feb. 2000, pp. 94–95, 128–129, 409–410.

Durlam et al., "Nonvolatile RAM based on Magnetic Tunnel Junction Elements", ISSCC Digest of Technical Papers, TA7.3, Feb. 2000, pp. 96–97, 130–131, 410–411.

* cited by examiner

Primary Examiner—M. Tran
(74) Attorney, Agent, or Firm—McDermott, Will & Emery

(57) ABSTRACT

A tunneling magneto-resistance element of each MTJ (magnetic tunnel junction) memory cell is connected between a bit line and a strap. Each strap is shared by a plurality of tunneling magneto-resistance elements that are located adjacent to each other in the row direction in the same sub array. Each access transistor is connected between a corresponding strap and a ground voltage, and turned ON/OFF in response to a corresponding word line. Since data read operation can be conducted with the structure that does not have an access transistor for every tunneling magneto-resistance element, the array area can be reduced.

20 Claims, 20 Drawing Sheets

THIN FILM MAGNETIC MEMORY DEVICE SHARING AN ACCESS ELEMENT BY A PLURALITY OF MEMORY CELLS

BACKGROUND OF THE INVENTION

1. Field of the Invention

The present invention generally relates to a thin film magnetic memory device. More particularly, the present invention relates to a random access memory (RAM) including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 18 schematically shows the structure of a memory cell having a magnetic tunnel junction (hereinafter, sometimes simply referred to as "MTJ memory cell").

Referring to FIG. 18, the MTJ memory cell includes a tunneling magneto-resistance element TMR having an electric resistance varying according to a magnetically written storage data level, and an access element ATR. Access transistor ATR is connected in series with tunneling magneto-resistance element TMR between a bit line BL and a ground line GL. Typically, a field effect transistor is used as access transistor ATR.

A bit line BL, a write digit line WDL, a word line WL and a ground line GL are provided for the MTJ memory cell. Bit line BL passes a data write current therethrough in data write operation, and passes a data read current therethrough in data read operation. Write digit line WDL passes a data write current therethrough in data write operation. Word line WL is used for data read operation. Ground line GL pulls down tunneling magneto-resistance element TMR to a ground voltage GND in data read operation.

In data read operation, tunneling magneto-resistance element TMR is electrically coupled between ground line GL (ground voltage GND) and bit line BL in response to turning-ON of access transistor ATR.

FIG. 19 is a conceptual diagram illustrating data write operation to the MTJ memory cell.

Referring to FIG. 19, tunneling magneto-resistance element TMR has a magnetic layer FL having a fixed magnetization direction (hereinafter, sometimes simply referred to as "fixed magnetic layer"), and a magnetic layer VL that is magnetized in the direction according to a data write magnetic field generated by a data write current (hereinafter, sometimes simply referred to as "free magnetic layer"). A tunneling barrier TB is interposed between fixed magnetic layer FL and free magnetic layer VL. Tunneling barrier TB is formed from an insulting film. Free magnetic layer VL is magnetized either in the same (parallel) direction as, or in the opposite (antiparallel) direction to, that of fixed magnetic layer FL according to the write data level.

The electric resistance of tunneling magneto-resistance element TMR varies according to the relation between the respective magnetization directions of fixed magnetic layer FL and free magnetic layer VL. More specifically, when fixed magnetic layer FL and free magnetic layer VL have parallel magnetization directions, tunneling magneto-resistance element TMR has a smaller electric resistance than when they have antiparallel magnetization directions.

In data write operation, word line WL is inactivated and access transistor ATR is turned OFF. In this state, a data write current for magnetizing free magnetic layer VL is applied to bit line BL and write digit line WDL in the direction according to the write data level. In other words, the magnetization direction of free magnetic layer VL is determined according to the direction of the data write current flowing through bit line BL and write digit line WDL.

FIG. 20 is a conceptual diagram illustrating the relation between the data write current and magnetization of free magnetic layer VL.

Referring to FIG. 20, magnetic field Hx on the abscissa indicates the direction of a magnetic field H(WDL) produced by a data write current flowing through write digit line WDL. On the other hand, magnetic field Hy on the ordinate indicates a magnetic field H(BL) produced by a data write current flowing through bit line BL.

The magnetization direction of free magnetic layer VL can be rewritten only when the sum of magnetic fields H(WDL) and H(BL) reaches the region outside the asteroid characteristic line shown in the figure. In other words, in order to conduct data write operation, a data write current sufficient to produce a magnetic field exceeding a prescribed strength must be applied to both write digit line WDL and bit line BL.

When a magnetic field corresponding to the region inside the asteroid characteristic line is applied, the magnetization direction of free magnetic layer VL does not change. In other words, data write operation is not conducted when a prescribed data write current is supplied to either write digit line WDL or bit line BL. The magnetization direction written to tunneling magneto-resistance element TMR, i.e., the storage data level, is held in a non-volatile manner until another data write operation is conducted.

FIG. 21 is a conceptual diagram illustrating data read operation from the MTJ memory cell.

Referring to FIG. 21, in data read operation, access transistor ATR is turned ON in response to activation of word line WL. As a result, tunneling magneto-resistance element TMR pulled down to ground voltage GND is electrically coupled to bit line BL. In this state, a data read current Is is supplied to a current path including bit line BL and tunneling magneto-resistance element TMR. As a result, the voltage on bit line BL changes according to the electric resistance of the tunneling magneto-resistance element TMR, that is, the storage data level of the MTJ memory cell. For example, a data read current Is is supplied after bit line BL is precharged to a prescribed voltage. In this case, the storage data in the MTJ memory cell can be read by sensing the voltage on bit line BL.

Note that, in data read operation, a data read current flows through tunneling magneto-resistance element TMR.

However, data read current Is is commonly one to two orders smaller than the above data write current. Accordingly, the MTJ memory cell is not likely to be erroneously rewritten by the data read current Is in data read operation.

FIG. 22 shows the structure of a MTJ memory cell fabricated on a semiconductor substrate.

Referring to FIG. 22, an access transistor ATR formed on a semiconductor main substrate SUB has source/drain regions (n-type regions) 310, 320 and a gate 330. Source/drain region 310 is electrically coupled to a ground line GL through a metal film formed in a contact hole 341.

Write digit line WDL is formed in a metal wiring layer above ground line GL. A tunneling magneto-resistance element TMR is formed in a layer above write digit line WDL. Tunneling magneto-resistance element TMR is electrically coupled to source/drain region 320 of access transistor ATR through a strap SL and a metal film formed in a contact hole 340. Strap SL is formed from an electrically conductive material, and serves to electrically couple tunneling magneto-resistance element TMR to access transistor ATR.

Bit line BL is electrically coupled to tunneling magneto-resistance element TMR and is formed in a layer above tunneling magneto-resistance element TMR. As described before, in data write operation, a data write current must be supplied to both bit line BL and write digit line WDL. On the other hand, in data read operation, a word line WL is activated to, e.g., a high voltage state to turn ON access transistor ATR. As a result, tunneling magneto-resistance element TMR is pulled down to ground voltage GND through access transistor ATR, and electrically coupled to bit line BL.

Bit line BL receiving a data write current and a data read current and write digit line WDL receiving a data write current are each formed in a metal wiring layer. However, since word line WL is provided to control the gate voltage of access transistor ATR, a current need not be actively applied to word line WL. Accordingly, for improved integration, word line WL is commonly formed in the same wiring layer as that of gate 330 by using a polysilicon or polycide layer. In other words, an additional independent metal wiring layer need not be provided for word line WL.

As shown in FIG. 22, however, strap SL and contact hole 340 for electrically coupling tunneling magneto-resistance element TMR to access transistor ATR in reading the data from the MTJ memory cell must bypass write digit line WDL. Such a limitation on layout prevents improved integration from being achieved for a MRAM device integrating a plurality of MTJ memory cells, causing increased array area.

The electric resistance of a tunneling magneto-resistance element TMR applied to a MRAM device is commonly about several tens of kilo-ohms. Moreover, a bit line receiving a data read current in data read operation has parasitic capacitance. An increased RC time constant in a path of the data read current makes it difficult to increase the speed of data read operation conducted by sensing the voltage on bit line BL.

SUMMARY OF THE INVENTION

It is an object of the present invention to provide a thin film magnetic memory device capable of reducing the area of a memory array integrating MTJ memory cells.

It is another object of the present invention to provide a thin film magnetic memory device having MTJ memory cells, which is capable of improving the read operation speed.

In summary, according to one aspect of the present invention, a thin film magnetic memory device includes a memory array, a plurality of first signal lines and a plurality of second signal lines (straps). The memory array includes a plurality of memory cells arranged in a matrix, and is divided into a plurality of column groups along a column direction. Each memory cell includes a tunneling magneto-resistance element having an electric resistance varying according to storage data magnetically written therein. The plurality of first signal lines are provided respectively corresponding to the memory cell columns. The plurality of second signal lines are provided respectively corresponding to the plurality of column groups in each memory cell row. Each tunneling magneto-resistance element is electrically coupled between corresponding one of the first signal lines and corresponding one of the second signal lines.

Preferably, the thin film magnetic memory device further includes a plurality of word lines provided respectively corresponding to the memory cell rows and selectively activated according to a row selection result in data read operation, and a plurality of access switches provided respectively corresponding to the plurality of second signal lines. Each access switch is electrically coupled between corresponding one of the second signal lines and a first voltage, and is turned ON in response to activation of corresponding one of the word lines.

Accordingly, a main advantage of the present invention is that a contact hole for electrically coupling a tunneling magneto-resistance element to another element such as access transistor need not be provided for every tunneling magneto-resistance element. In other words, the contact hole having a strict limitation on layout need only be provided for every second signal line (strap). This enables reduction in area of the memory array having tunneling magneto-resistance elements.

According to another aspect of the present invention, a thin film magnetic memory device includes a plurality of memory cells, a reference current generator and a data read circuit. Each memory cell stores storage data that is set to either a first or second level. Each memory cell includes a tunneling magneto-resistance element having either a first or second electric resistance according to the level of the storage data magnetically written therein. A memory cell selected from the plurality of memory cells for data read operation is electrically coupled between first and second voltages. The reference current generator generates a reference current equal to an intermediate value of first and second currents. The first current is a current that flows through the selected memory cell when the storage data is at the first level. The second current is a current that flows through the selected memory cell when the storage data is at the second level. The data read circuit reads the storage data based on comparison between a memory cell current flowing through the selected memory cell and the reference current.

Preferably, the thin film magnetic memory device further includes a bit line provided for every prescribed region of the plurality of memory cells, a bit line driving portion for driving a bit line corresponding to the selected memory cell to the first voltage, an access portion for electrically coupling the selected memory cell between the bit line corresponding to the selected memory cell and the second voltage, and a current detector having an internal node connected to the bit line corresponding to the selected memory cell, for producing a detection current according to the memory cell current. The data read circuit reads the storage data based on comparison between the detection current from the current detector and the reference current from the reference current generator.

Since the above thin film magnetic memory device conducts data read operation based on a memory cell current flowing through the selected memory cell, the read operation speed can be improved.

Preferably, the thin film magnetic memory device further includes a bit line provided for every prescribed region of the plurality of memory cells, a bit line driving portion for driving the bit line corresponding to the selected memory cell to the first voltage, and an access portion for electrically coupling the selected memory cell between the bit line corresponding to the selected memory cell and a first input node. The data read circuit includes a driving portion for electrically coupling the first input node to the second voltage at least for a prescribed period after data read operation is started.

Since the above thin film magnetic memory device conducts data read operation by directly using a memory cell current flowing through the selected memory cell, the read operation speed can further be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
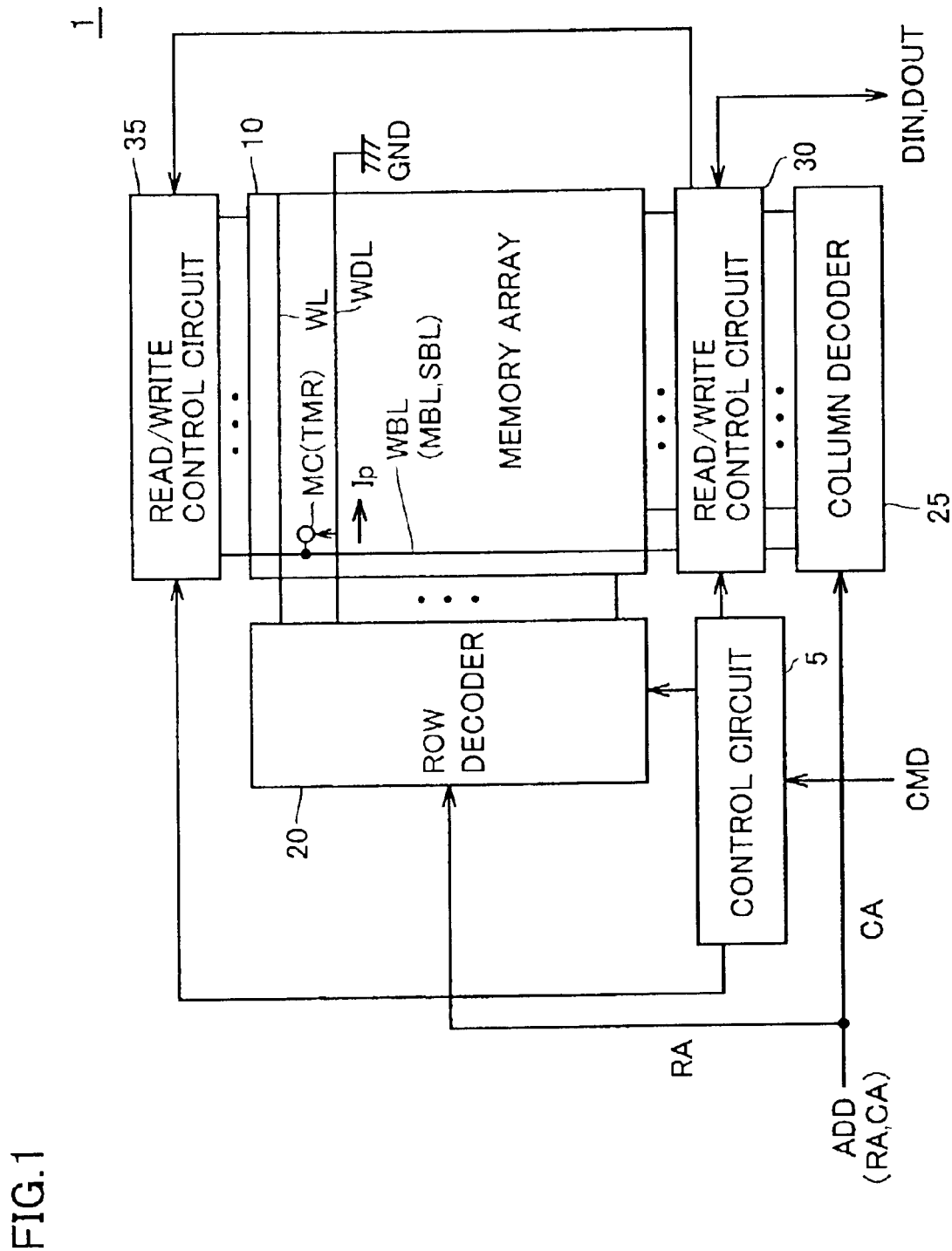
FIG. 1 is a schematic block diagram showing the overall structure of an MRAM device according to an embodiment of the present invention.

Hereinafter, embodiments of the present invention will be described in detail with reference to the accompanying drawings. Note that the same reference numerals and characters denote the same or corresponding portions throughout the figures.

First Embodiment

Referring to FIG. 1, an MRAM device 1 according to an embodiment of the present invention conducts random access in response to an external control signal CMD and an external address signal ADD in order to receive write data DIN and output read data DOUT.

MRAM device 1 includes a control circuit 5 for controlling the overall operation of MRAM device 1 in response to control signal CMD, and a memory array 10 having MTJ memory cells MC arranged in a matrix.

As can be seen from the description below, in the embodiment of the present invention, a plurality of tunneling magneto-resistance elements TMR share an access transistor ATR. Therefore, in memory array 10, each of the plurality of tunneling magneto-resistance elements TMR serves as a MTJ memory cell MTJ. In the specification, rows and columns of the plurality of tunneling magneto-resistance elements TMR arranged in a matrix in memory array 10 are sometimes referred to as memory cell rows and memory cell columns.

Figure 19:
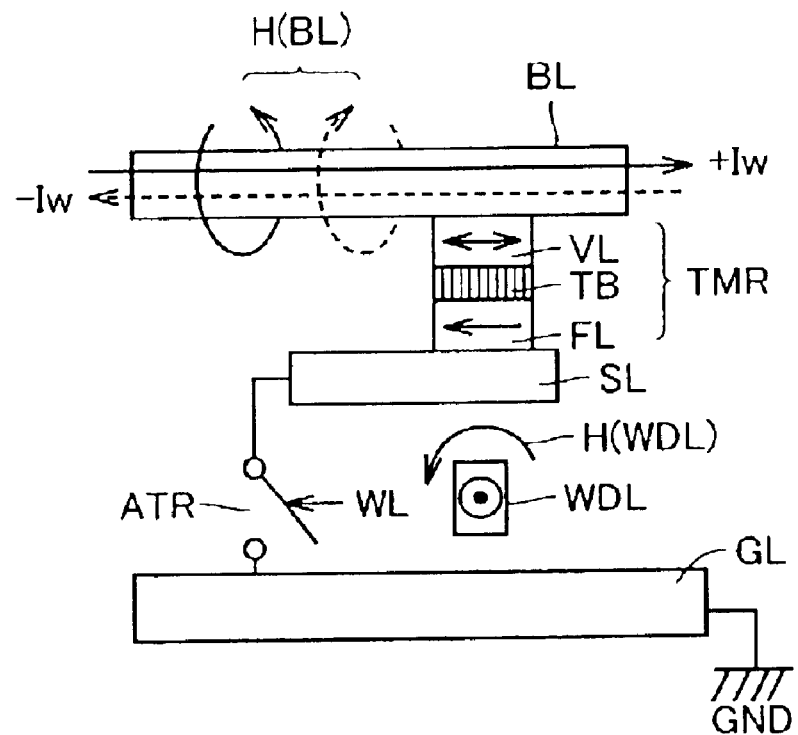
FIG. 19 is a conceptual diagram illustrating data write operation to an MTJ memory cell.
Figure 20:
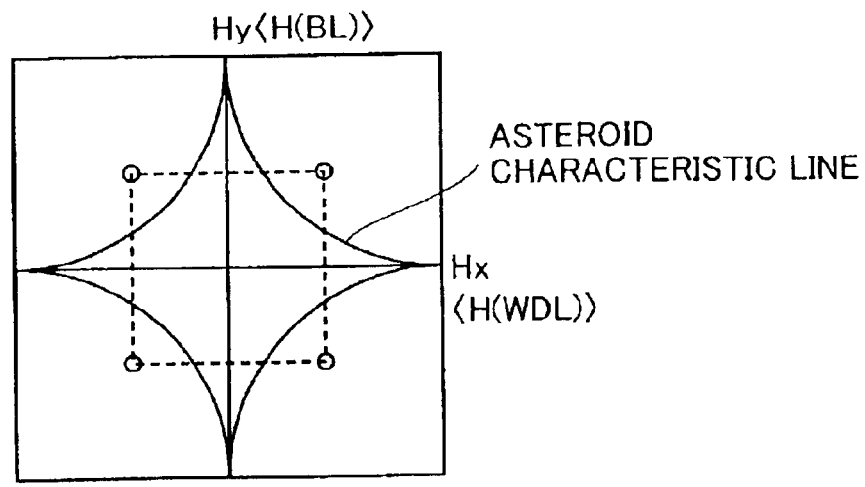
FIG. 20 is a conceptual diagram showing the relation between a data write current and magnetization of a free magnetic layer.
Figure 21:
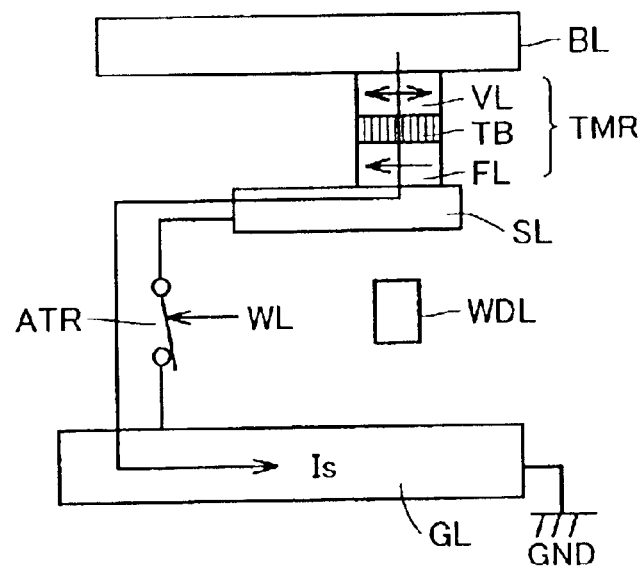
FIG. 21 is a conceptual diagram illustrating data read operation from an MTJ memory cell.
Figure 22:
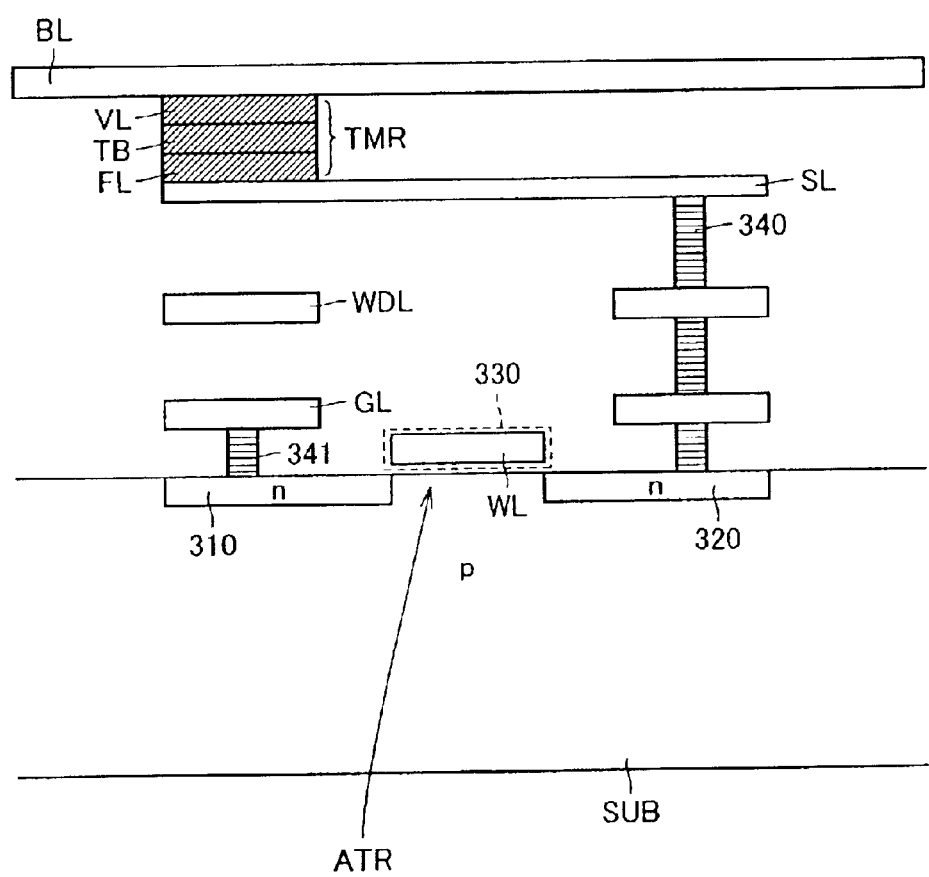
FIG. 22 shows the structure of an MTJ memory cell fabricated on a semiconductor substrate.

Since the structure of tunneling magneto-resistance element TMR and the principles of data storage in tunneling magneto-resistance element TMR are the same as those described in connection with FIG. 19, detailed description thereof will not be repeated. Each tunneling magneto-resistance element TMR stores either H level ("1") or L level ("0") as storage data, and the electric resistance thereof varies according to the storage data level.

FIG. 1 exemplarily shows a single MTJ memory cell MC (tunneling magneto-resistance element TMR), and a corresponding word line WL, write digit line WDL and bit line BL. Word lines WL and write digit lines WDL are provided corresponding to the memory cell rows. Bit lines BL are provided corresponding to the memory cell columns. Note that, in the illustrated embodiment of the present invention, bit line BL is provided in a hierarchical manner by way of example. In other words, bit line BL is divided into main bit line MBL and sub bit line SBL.

In data write operation, a data write current of the row direction is applied to a write digit line WDL of the memory cell row corresponding to the selected memory cell (hereinafter, sometimes referred to as "selected row"), and a data write current of the column direction is applied to a bit line BL of the memory cell column corresponding to the selected memory cell (hereinafter, sometimes referred to as "selected column"). In data read operation, a word line WL corresponding to the selected row is activated, whereby a data read current flows through the selected memory cell and bit line BL.

Arrangement of the MTJ memory cells and the above signal lines in memory array 10 will be specifically described later. Note that, in the following description, high voltage state (power supply voltage Vcc) and low voltage state (ground voltage GND) of the signals, signal lines, data and the like are sometimes referred to as "H level" and "L level", respectively.

MRAM device 1 further includes a row decoder 20 for decoding a row address RA of an address signal ADD and selecting a row in memory array 10, a column decoder 25 for decoding a column address CA of address signal ADD and selecting a column in memory array 10, and read/write control circuits 30, 35. Read/write control circuits 30, 35 collectively refers to a circuit for supplying a data write current to a bit line BL in data write operation, a circuit for supplying a data read current to a bit line BL in data read operation, a circuit for producing read data DOUT in data read operation, and the like.

Write digit lines WDL are coupled to ground voltage GND in a region facing row decoder 20 with memory array 10 interposed therebetween. In data write operation, row decoder 20 couples a write digit line WDL selected according to the row selection result to power supply voltage Vcc. Write digit line WDL thus activated is connected to power supply voltage Vcc and ground voltage GND at both ends thereof. This allows a data write current Ip of the row direction to be applied to the activated write digit line WDL. Data write current Ip of the row direction has a fixed direction regardless of the write data level.

Row decoder 20 retains non-selected write digit lines WDL at ground voltage GND so that data write current Ip of the row direction will not flow therethrough.

How a data write current of the column direction is supplied to bit line BL will be specifically described later. Data is magnetically written to tunneling magneto-resistance element TMR having its corresponding write digit line WDL and bit line BL receiving a data write current.

Figure 2:
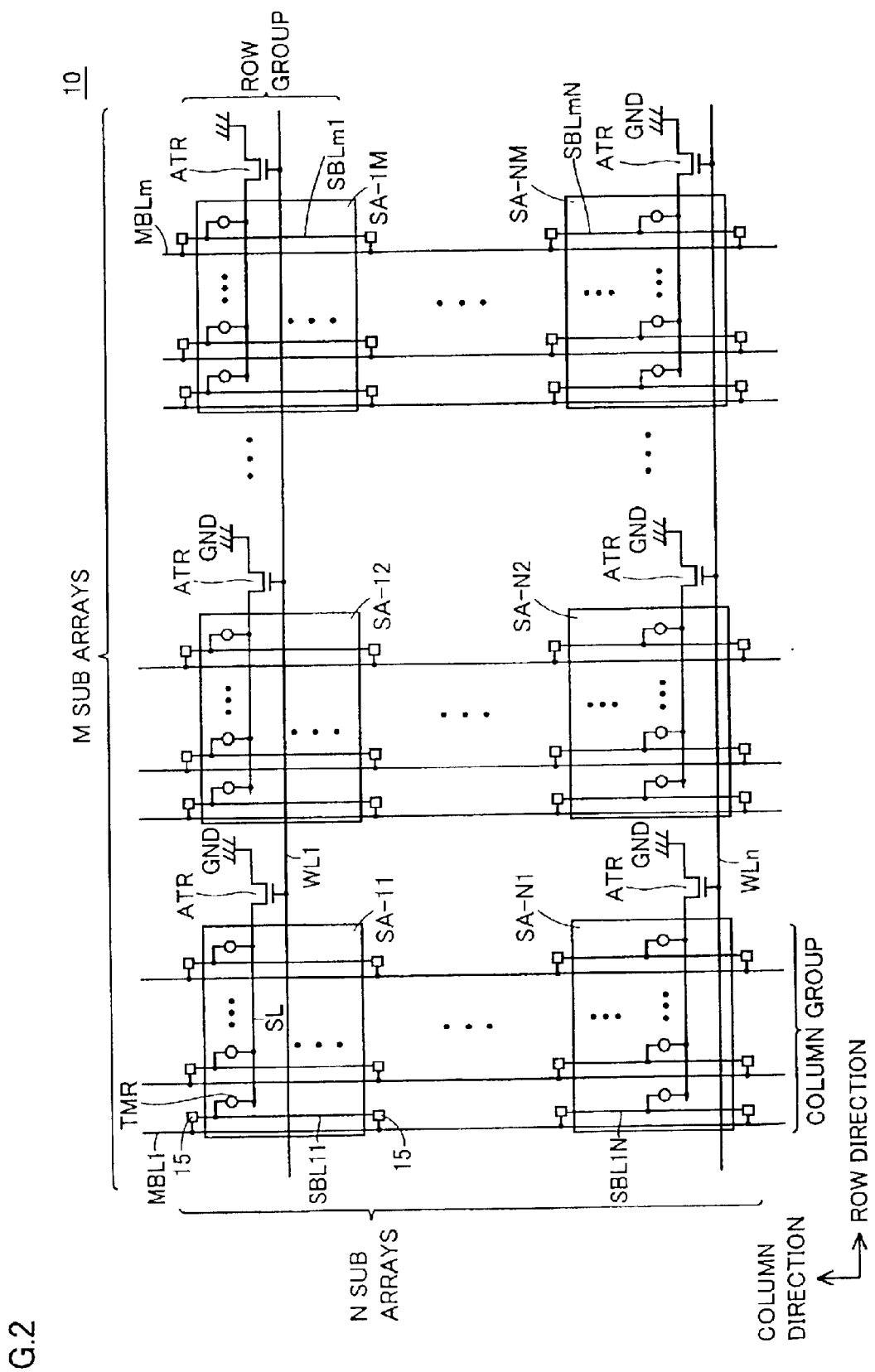
FIG. 2 specifically shows the structure in a memory array in FIG. 1 relating to data read operation.

FIG. 2 specifically shows the structure in memory array 10 relating to the data read operation.

Referring to FIG. 2, memory array 10 is divided into sub arrays SA-11 to SA-NM of N rows by M columns (where N, M are a natural number). Hereinafter, sub arrays SA-11 to SA-NM are sometimes generally referred to as sub arrays SA. A sub array including the selected memory cell is sometimes simply referred to as selected sub array.

N sub arrays SA that are adjacent to each other in the column direction form a column group. Accordingly, memory array 10 is divided into M column groups. Each column group corresponds to L memory cell columns (where L is an integer of at least two). Similarly, M sub arrays SA that are adjacent to each other in the row direction form a row group. Therefore, memory array 10 is divided into N row groups. Hereinafter, a row group including the selected sub array is sometimes referred to as selected array row, and a column group including the selected sub array is sometimes referred to as selected array column.

In each sub array SA, tunneling magneto-resistance elements TMR are arranged in a matrix. In the entire memory array 10, a plurality of tunneling magneto-resistance elements TMR are arranged in n rows by m columns (where n, m are a natural number). Each tunneling magneto-resistance element TMR serves as a MTJ memory cell.

M sub arrays SA of the same row group have common word lines WL1 to WLn corresponding to the memory cell rows. Although not shown in FIG. 2, write digit lines WDL1 to WDLn are also provided corresponding to the memory cell rows in the same manner as that of word lines WL1 to WLn.

N sub arrays SA of the same column group have common main bit lines MBL1 to MBLn corresponding to the memory cell columns. Sub bit lines respectively corresponding to N sub arrays SA of the same column group are provided in every memory cell column. For example, sub bit lines SBL11 to SBL1N respectively corresponding to sub arrays SA-11 to SA-N1 are provided for main bit line MBL1. Accordingly, sub bit lines SBL11 to SBLmN are provided in the entire memory array 10.

Note that, in the following description, word lines WL1 to WLn, write digit lines WDL1 to WDLn, main bit lines MBL1 to MBLm and sub bit lines SBL11 to SBLmN are sometimes generally referred to as word lines WL, write digit lines WDL, main bit lines MBL and sub bit lines SBL.

In each sub array SA, a strap SL is provided in every memory cell row. Each strap SL serves as a signal line along the row direction. An access transistor ATR is provided for every strap SL. Therefore, in each memory cell row, M access transistors ATR and M straps SL are provided corresponding to the respective column groups. L tunneling magneto-resistance elements TMR of the same memory cell row in the same sub array share a corresponding strap SL and a corresponding access transistor ATR.

M access transistors ATR of the same memory cell row have their gates coupled to a corresponding word line WL. For example, access transistors ATR of the first memory cell row in FIG. 2 have their gates coupled to word line WL1. Each access transistor ATR is electrically coupled between a corresponding strap SL and ground voltage GND.

In data read operation, row decoder 20 selectively activates one of word lines WL1 to WLn according to the row selection result. Word line WL thus activated pulls down a plurality of tunneling magneto-resistance elements TMR of the selected row to ground voltage GND.

Connection control portions 15 control connection and disconnection between main bit line MBL and sub bit line SBL.

Figure 3:
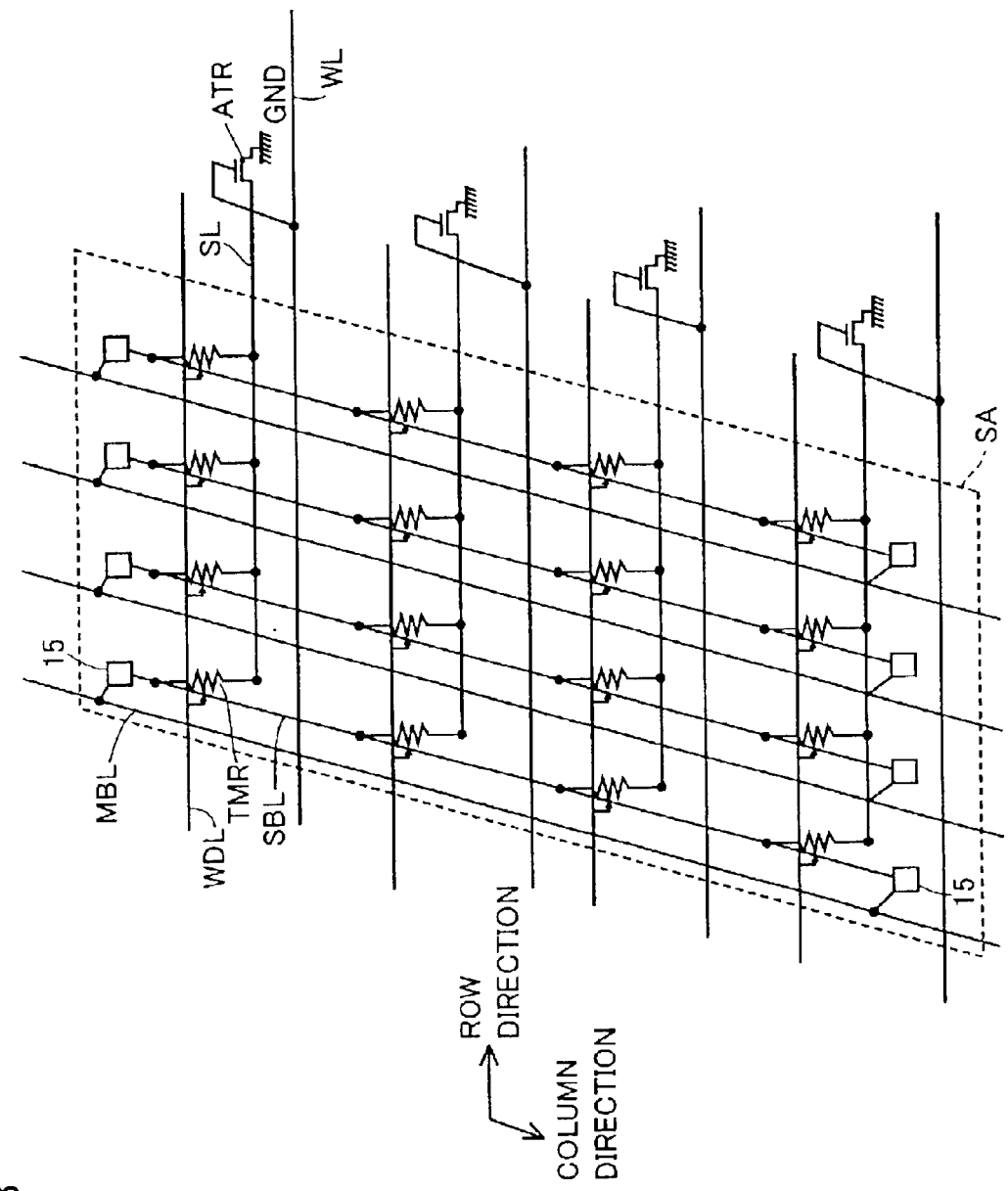
FIG. 3 is a circuit diagram specifically showing the structure of a sub array in FIG. 2.

In the example of FIG. 3, each sub array SA includes tunneling magneto-resistance elements TMR arranged in four rows by four columns (L=4).

Referring to FIG. 3, in sub array SA, four (L) tunneling magneto-resistance elements TMR of the same memory cell row are coupled to the same strap SL. An access transistor ATR is provided for every strap SL shared by four tunneling magneto-resistance elements TMR.

Word lines WL and write digit lines WDL extend in the row direction across M sub arrays of the same row group. Access transistor ATR electrically couples a corresponding strap SL to ground voltage GND in response to activation of a word line WL of a corresponding memory cell row.

In each memory cell column, a main bit line MBL shared by N sub arrays and sub bit lines SBL of the respective sub arrays are provided in a hierarchical manner. Accordingly, in each sub array SA, connection control portions 15 for controlling connection and disconnection between sub bit line SBL and main bit line MBL are provided between main bit line MBL and both ends of sub bit line SBL.

Main bit line MBL is provided in a layer above sub bit line SBL. In other words, main bit line MBL is located farther away from tunneling magneto-resistance element TMR than is sub bit line SBL.

Figure 4:
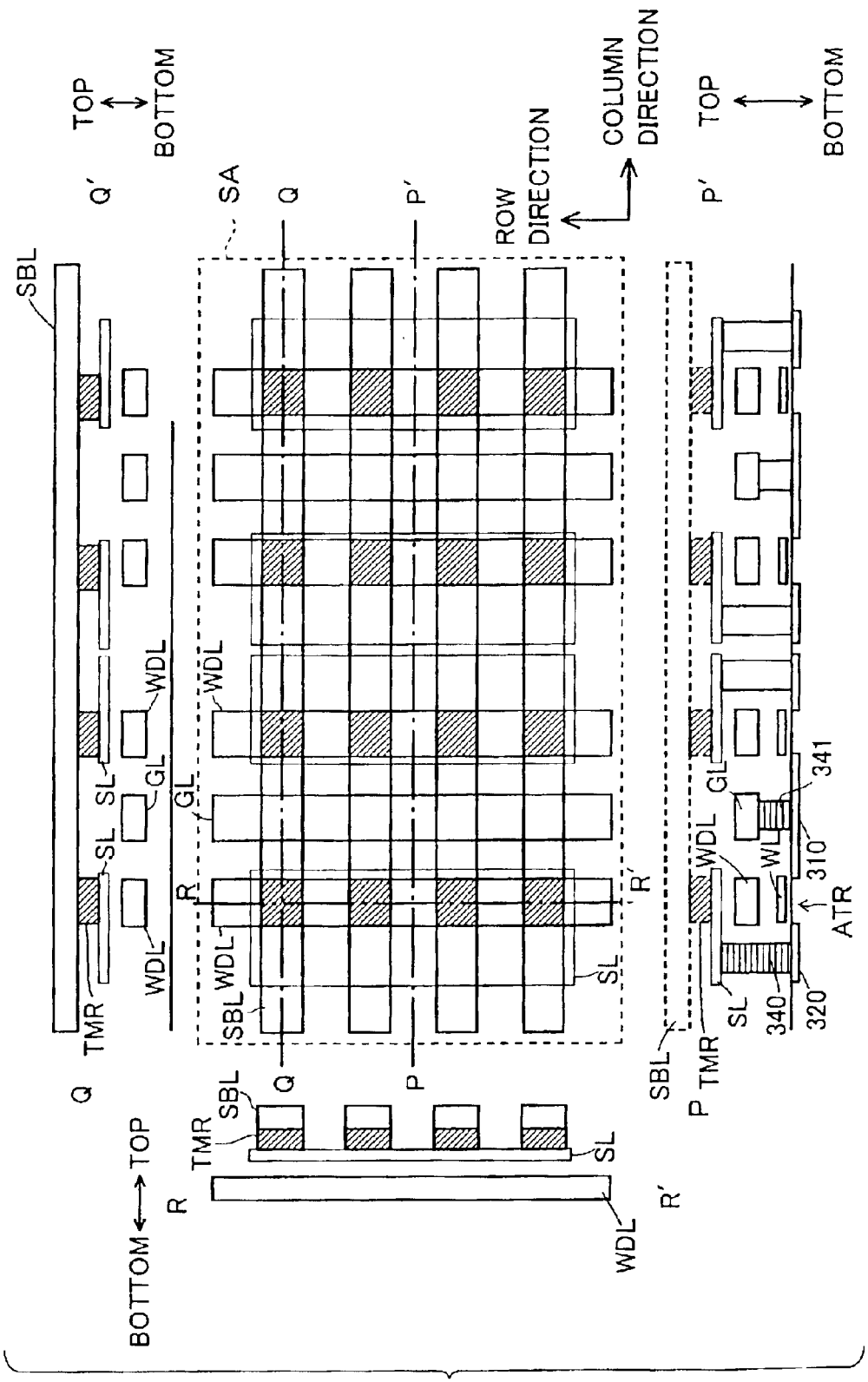
FIG. 4 shows an example of the layout of the sub array in FIG. 3.

FIG. 4 shows an example of the layout of the sub array in FIG. 3. A plan view of sub array SA is given in the center of FIG. 4.

Referring to this plan view, four write digit lines WDL corresponding to four memory cell rows and four sub bit lines SBL corresponding to four memory cell columns are provided in the row direction and column direction, respectively. Ground lines GL are provided in the row direction. Although not shown in the figure, ground lines GL are connected to ground voltage GND.

A tunneling magneto-resistance element TMR functioning as a MTJ memory cell is provided at every intersection of sub bit line SBL and write digit line WDL, as shown by shaded portions in FIG. 4. A strap SL is provided in every memory cell row. Therefore, each strap SL is shared by four (L) tunneling magneto-resistance elements TMR of the same memory cell row.

FIG. 4 further includes cross-sectional views taken along line P—P', Q—Q' and R—R' in the plan view of sub array SA (hereinafter, these cross-sectional views are referred to as P—P' cross section, Q—Q' cross section and R—R' cross section, respectively).

P—P' cross section shows a region where access transistors ATR are provided. Referring to P—P' cross section, source/drain region 310 of access transistor ATR is electrically coupled to ground line GL through contact hole 341. Source/drain region 320 of access transistor ATR is electrically coupled to strap SL through contact hole 340. Word line WL extending in the row direction is provided in the gate region of access transistor ATR. Write digit line WDL extending in the row direction is provided in a layer between word line WL and strap SL.

Since each strap SL is shared by a plurality of memory cells located adjacent to each other in the row direction, access transistor ATR can be provided in a region other than the regions above and below tunneling magneto-resistance element TMR. In other words, tunneling magneto-resistance elements TMR and sub bit line SBL shown by dashed line in P—P' cross section are not provided in this region.

Q—Q' cross section is a cross section along sub bit line SBL. Tunneling magneto-resistance elements TMR are provided in this region. Referring to Q—Q' cross section, each tunneling magneto-resistance element TMR is electrically coupled to sub bit line SBL and a corresponding strap SL. Sub bit line SBL is formed in a layer above tunneling magneto-resistance element TMR, and strap SL is formed in a layer below tunneling magneto-resistance element TMR. Q—Q' cross section shows write digit lines WDL and ground lines GL extending in the row direction. However, access transistor ATR is not provided in a layer below tunneling magneto-resistance element TMR.

R—R' cross section in FIG. 4 is a cross section along write digit line WDL. Note that R—R' cross section shows only the layers above write digit line WDL.

Write digit line WDL passes therethrough a data write current for writing data to tunneling magneto-resistance element TMR. Therefore, write digit line WDL is provided in a region right under tunneling magneto-resistance element TMR. Accordingly, tunneling magneto-resistance element TMR electrically coupled to strap SL and sub bit line SBL is provided in a layer above write digit line WDL. As described above, in the same sub array, a common strap SL is coupled to a plurality of tunneling magneto-resistance elements TMR located adjacent to each other in the row direction.

Since the plurality of tunneling magneto-resistance elements TMR along the row direction shares a strap SL, contact hole 340 for electrically coupling access transistor ATR to tunneling magneto-resistance element TMR need no longer be provided for each tunneling magneto-resistance element TMR. In particular, this structure enables access transistor ATR to be provided in a region other than the regions above and below tunneling magneto-resistance element TMR.

Accordingly, tunneling magneto-resistance elements TMR are arranged at a smaller pitch both in the row direction and column direction than in the structure in which access transistor ATR is provided for every tunneling magneto-resistance element TMR. As a result, the overall area of the memory array 10 can be reduced.

Figure 5:
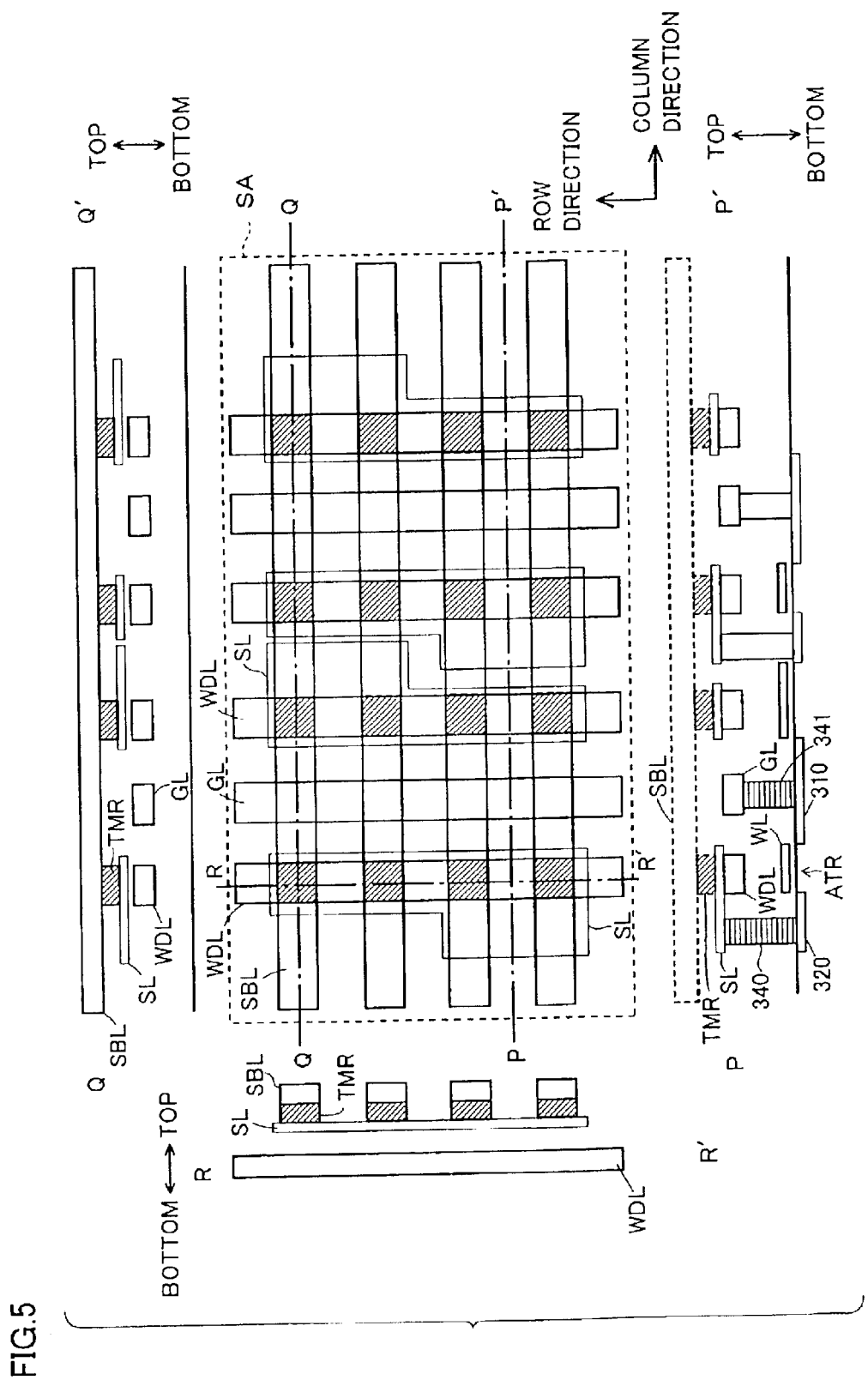
FIG. 5 shows another example of the layout of the sub array in FIG. 3.

The layout of sub array SA in FIG. 5 is different from that of FIG. 4 in two-dimensional shape of strap SL. Since the layout of FIG. 5 is otherwise the same as that of FIG. 4, detailed description thereof will not be repeated. P—P' cross section, Q—Q' cross section and R—R' cross section in FIG. 5 correspond to those in FIG. 4.

The layout of FIG. 5 is the same as that of FIG. 4 in that each strap SL is shared by L (four) tunneling magneto-resistance elements TMR of the same memory cell row in the same sub array SA.

In the layout of FIG. 5, however, strap SL has a larger width in a region where contact hole 340 for coupling strap SL to access transistor ATR is required. In the remaining region, strap SL has a smaller width required for electrical contact with tunneling magneto-resistance element TMR. Straps SL having such a shape are arranged in a point-symmetrical manner in the column direction.

With this structure, the pitch in the column direction can be reduced in a region where straps SL face each other. As a result, the overall area of memory array 10 can further be reduced as compared to the layout of FIG. 4.

Hereinafter, data write operation in each sub array SA will be described.

Figure 6:
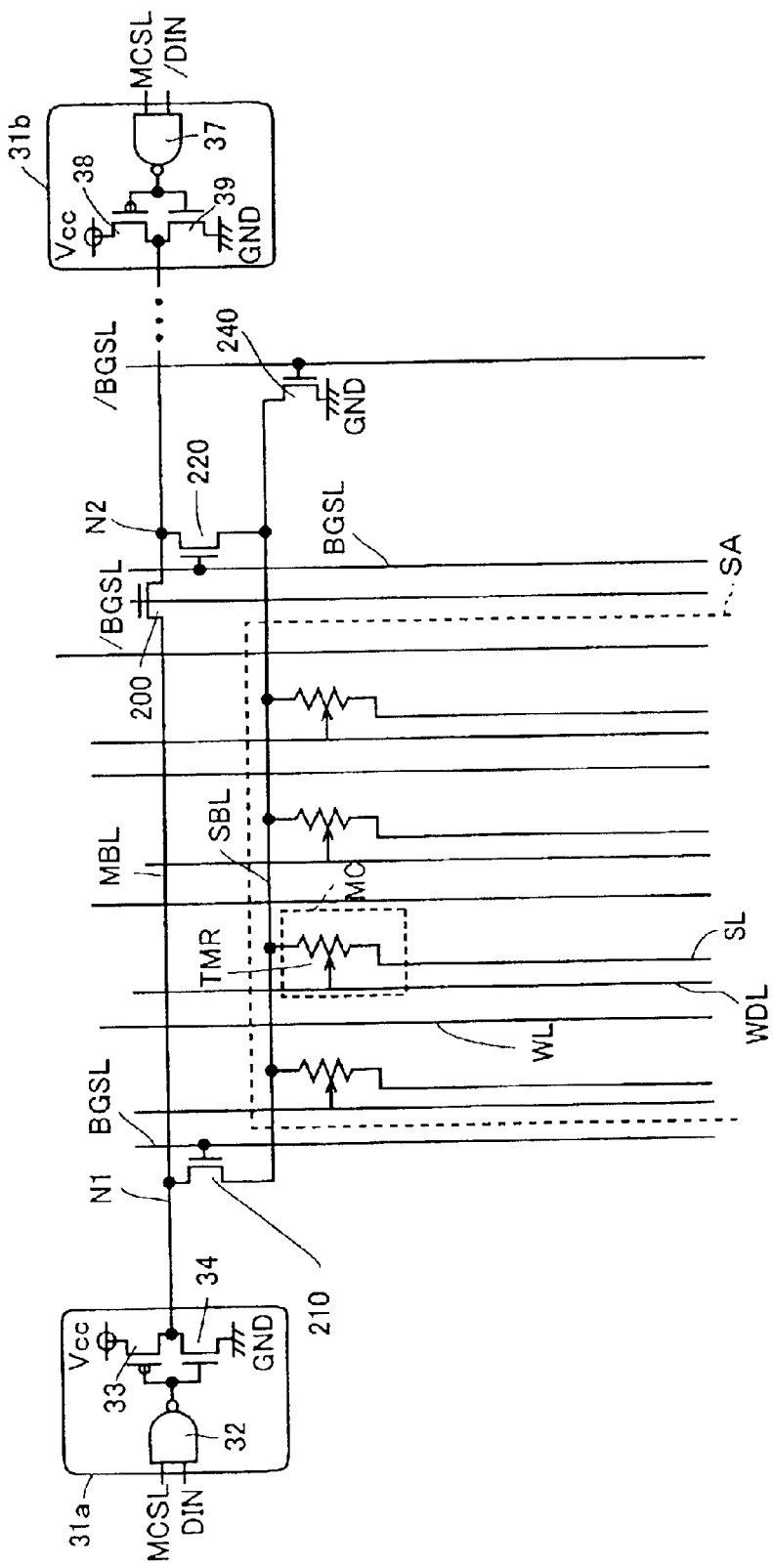
FIG. 6 is a circuit diagram showing the structure in the sub array relating to data write operation.

FIG. 6 exemplarily shows the structure for conducting data write operation in a memory cell column of interest.

Referring to FIG. 6, bit line drivers 31a, 31b are provided at both ends of each main bit line MBL, respectively. When a corresponding main bit line MBL is selected according to the row selection result, bit line driver 31a connects one end of main bit line MBL to one of power supply voltage Vcc and ground voltage GND according to the level of write data DIN. When a corresponding main bit line MBL is selected, bit line driver 31b connects the other end of main bit line MBL to the other voltage. Bit line drivers 31a, 31b thus operate complementarily to each other.

Bit line driver 31a includes a logic gate 32 and driver transistors 33, 34. Driver transistors 33, 34 form a CMOS (Complementary Metal Oxide Semiconductor) inverter. Logic gate 32 outputs the NAND operation result of a column selection signal MCSL and write data DIN. Column selection signal MCSL is a signal for selecting a main bit line MBL. Driver transistor 33 is a P-channel MOS (Metal Oxide Semiconductor) transistor and is provided between one end of main bit line MBL and power supply voltage Vcc. Driver transistor 34 is an N-channel MOS transistor and is provided between one end of main bit line MBL and ground voltage GND. The respective gate voltages of driver transistors 33, 34 are controlled by the output of logic gate 32.

Bit line driver 31b includes a logic gate 37 and driver transistors 38, 39. Driver transistors 38, 39 form a CMOS inverter. Logic gate 37 outputs the NAND operation result of a column selection signal MCSL and an inverted signal /DIN of write data DIN. Driver transistor 38 is a P-channel MOS transistor and is provided between the other end of main bit line MBL and power supply voltage Vcc. Driver transistor 39 is an N-channel MOS transistor and is provided between the other end of main bit line MBL and ground voltage GND. The respective gate voltages of driver transistors 38, 39 are controlled by the output of logic gate 37.

Accordingly, in bit line drivers 31a, 31b of main bit lines MBL of the non-selected columns, the respective outputs of logic gate 32, 37 are set to H level. As a result, main bit lines MBL of the non-selected columns are connected to ground voltage GND at both ends thereof.

On the other hand, bit line drivers 31a, 31b corresponding to main bit line MBL of the selected column connect one end of main bit line MBL to one of power supply voltage Vcc and ground voltage GND and the other end thereof to the other voltage according to the level of write data DIN.

Both ends of sub bit line SBL are coupled to nodes N1, N2 on main bit line MBL through transistor switches 210, 220, respectively. A transistor switch 200 is provided between nodes N1, N2. Sub bit line SBL is electrically coupled to ground voltage GND through a transistor switch 240. Transistor switches 200, 210, 220, 240 are included in connection control portion 15 in FIGS. 2 and 3.

In every memory cell block, transistor switch 200 is inserted in series with main bit line MBL. Transistor switch 200 is provided between nodes N1, N2 in each sub array SA, and serves to cut off the current path on main bit line MBL in the selected sub array.

Transistor switch 210 is provided between one end of sub bit line SBL and node N1 on main bit line MBL. Transistor switch 220 is provided between the other end of sub bit line SBL and node N2 on main bit line MBL. A row group selection signal BGSL is applied to the respective gates of transistor switches 210, 220. Row group selection signal BGSL is provided for every row group shown in FIG. 2, and is activated to H level when a corresponding row group includes the selected sub array.

Transistor switch 240 couples sub bit line SBL to ground voltage GND. An inverted signal /BGSL of row group selection signal BGSL is applied to the respective gates of transistor switches 200, 240. Transistor switch 240 is turned ON/OFF complementarily to transistor switches 210, 220. Transistor switch 240 connects sub bit line SBL to ground voltage GND when sub bit line SBL is not connected to main bit line MBL.

Figure 7:
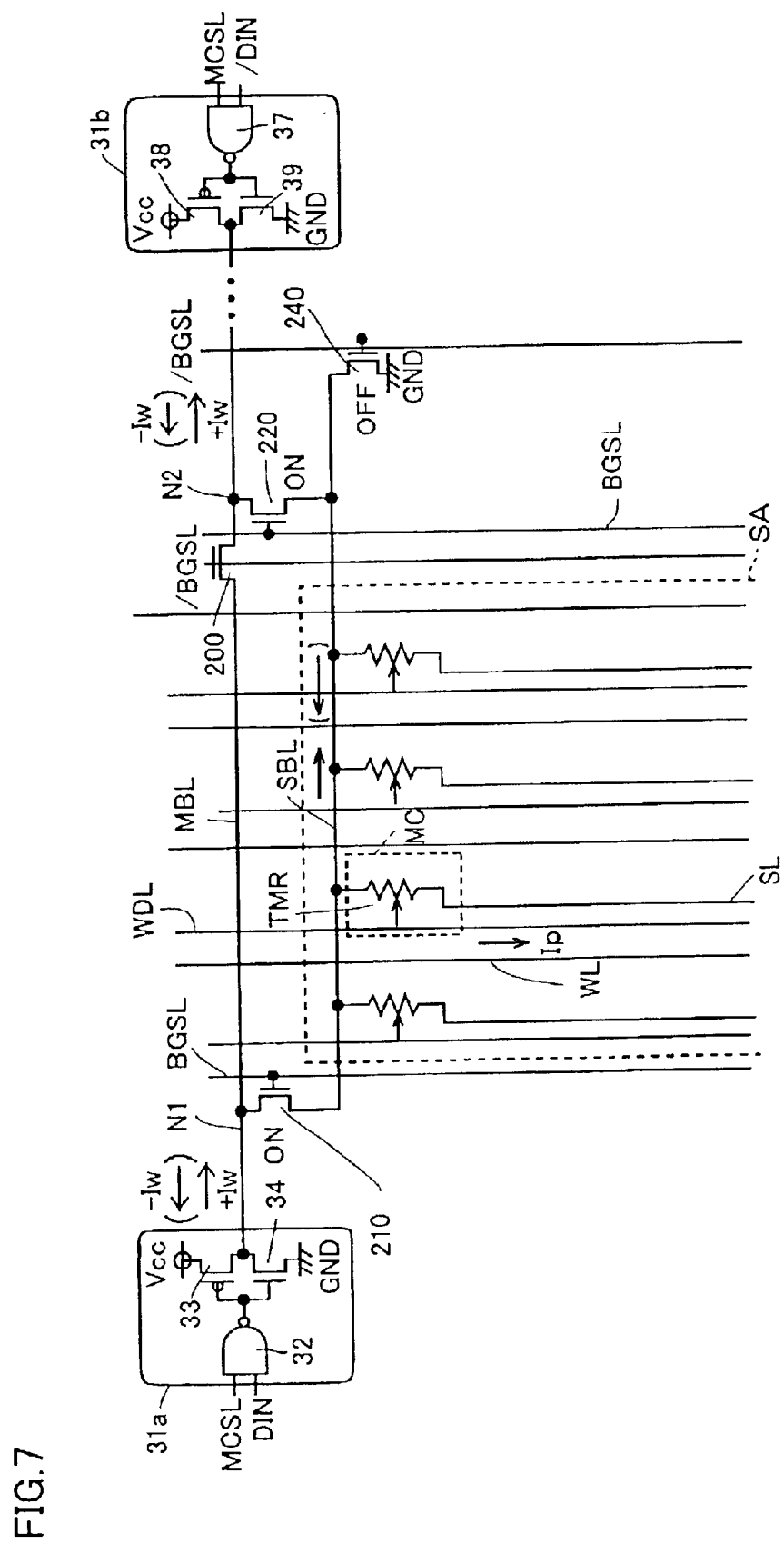
FIG. 7 is a circuit diagram illustrating a data write current path in the structure of FIG. 6.

FIG. 7 is a circuit diagram illustrating a path of a data write current in the structure of FIG. 6.

When H-level ("1") data is to be written to the selected memory cell connected to sub bit line SBL in FIG. 7, bit line driver 31a connects one end of main bit line MBL to power supply voltage Vcc, and bit line driver 31b connects the other end of main bit line MBL to ground voltage GND. In the selected sub array, a corresponding row group selection signal BGSL is set to H level.

As a result, transistor switches 210, 220 are turned ON and transistor switches 200, 240 are turned OFF. The current path between nodes N1, N2 on main bit line MBL is thus cut off. Main bit line MBL is coupled to sub bit line SBL at nodes N1, N2.

On the same main bit line MBL, transistor switches 200 in the other sub arrays are turned ON. Accordingly, in the regions corresponding to the non-selected sub arrays, a data write current +Iw passes through main bit line MBL. In the selected sub array, transistor switch 200 is turned ON, whereby the current path on main bit line MBL is cut off, and a data write current +Iw is supplied to sub bit line SBL through transistor switches 210, 220.

Based on the row selection result, a data write current Ip of the row direction is supplied to a write digit line WDL corresponding to the selected memory cell. H-level ("1") data can thus be written to the selected memory cell.

When L-level ("0") data is to be written to the selected memory cell, main bit line MBL is connected to power supply voltage Vcc and ground voltage GND in the opposite manner to that in the case of the H-level data. More specifically, one end of main bit line MBL is connected to ground voltage GND and the other end thereof is connected to power supply voltage Vcc. Since transistor switches 200 to 240 are turned ON/OFF in the same manner as that in the case of the H-level data, detailed description thereof will not be repeated.

In writing L-level data, a data write current −Iw of the opposite direction to that of data write current +Iw can be supplied to sub bit line MBL in the selected memory array. Based on the row selection result, a data write current Ip of the row direction is supplied to a write digit line WDL corresponding to the selected memory cell. L-level ("0") data can thus be written to the selected memory cell.

As described before, in data write operation, a data write current must be supplied to both write digit line WDL and bit line BL corresponding to the selected memory cell. Accordingly, the data write current is supplied to either bit line BL or write digit line WDL in the non-selected memory cells of the same memory cell row or memory cell column as that of the selected memory cell. Theoretically, no data is written to the non-selected memory cells. However, data may be slightly written to the non-selected memory cells due to the noise or the like. In other words, the magnetization direction of the tunneling magneto-resistance elements may possibly change. If such a phenomenon occurs repeatedly, the non-selected memory cells may possibly be rewritten, whereby storage data therein may be lost. Accordingly, such a risk of erroneous writing to the non-selected memory cells must be suppressed in data write operation.

According to the first embodiment, in the non-selected sub arrays, a data write current ±Iw of the column direction flows through main bit line MBL located away from tunneling magneto-resistance element TMR. This prevents data from being erroneously written to the tunneling magneto-resistance elements in the non-selected sub arrays.

In the selected memory array, a data write current ±Iw is supplied to sub bit line SBL located near tunneling magneto-resistance element TMR. As a result, a sufficient data write magnetic field is generated.

Hereinafter, data read operation of the first embodiment will be described.

Figure 8:
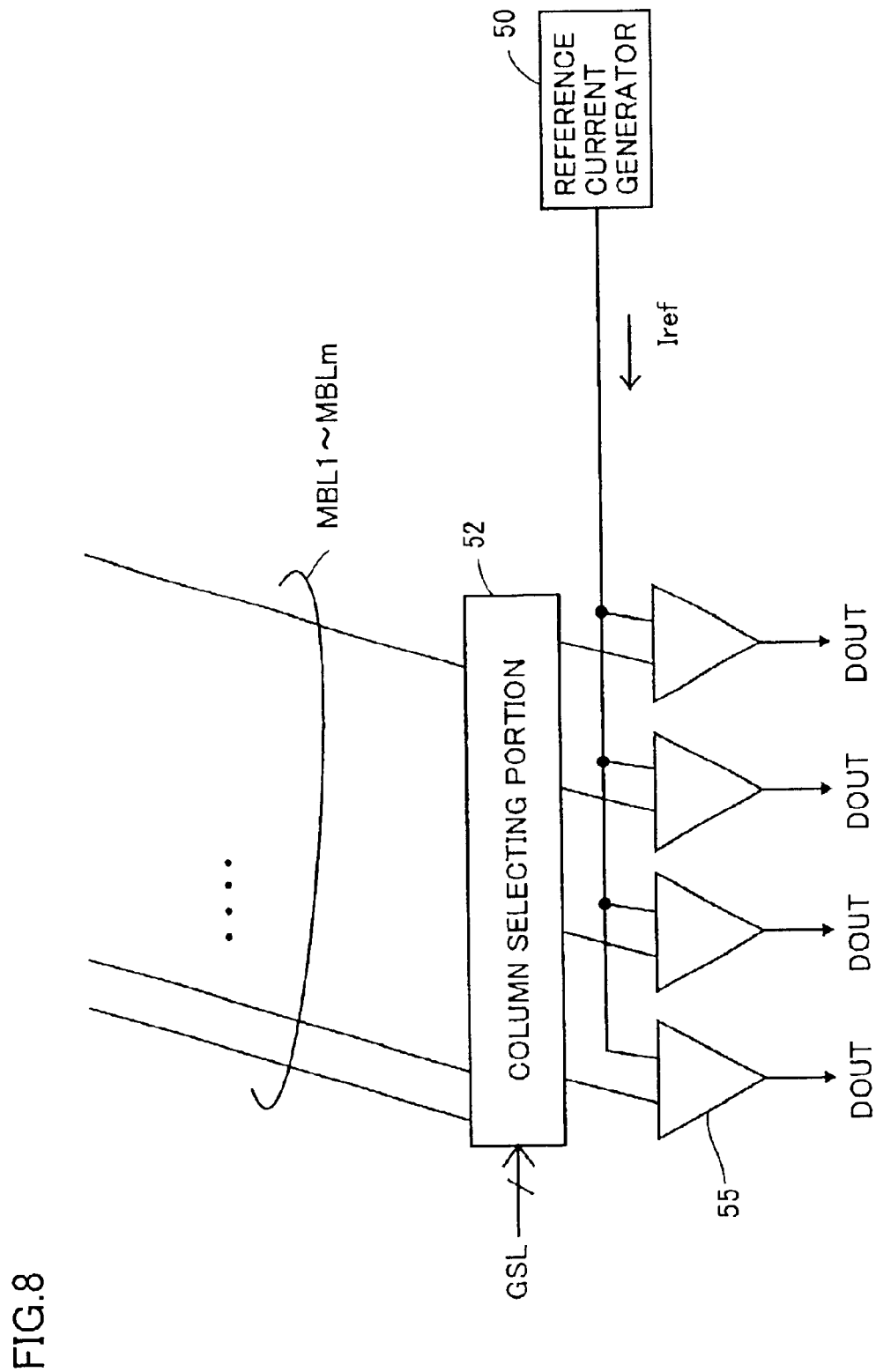
FIG. 8 is a block diagram showing arrangement of data read circuits according to a first embodiment of the present invention.

Referring to FIG. 8, L (four) tunneling magneto-resistance elements TMR sharing the same strap SL are coupled in parallel with ground voltage GND through a corresponding access transistor ATR according to the row selection result. Accordingly, in the first embodiment, L (four) data can be read in parallel in each read operation.

L (four) data read circuits 55 are therefore provided for memory array 10. A column selecting portion 52 selects L (four) of m main bit lines MBL1 to MBLm in the entire memory array 10 in response to a column group selection signal GSL, and connects the selected main bit lines MBL to L (four) data read circuits 55, respectively.

Column group selection signal GSL is a signal for selecting one of M straps SL coupled to ground voltage GND in response to activation of a word line WL. For example, column group selection signal GSL is a control signal for selecting one of M column groups in FIG. 2.

A reference current generator 50 generates a reference current Iref. Each data read circuit 55 produces read data DOUT based on comparison between a current flowing through a corresponding one of main bit lines MBL selected by column selecting portion 52 and reference current Iref.

Figure 9:
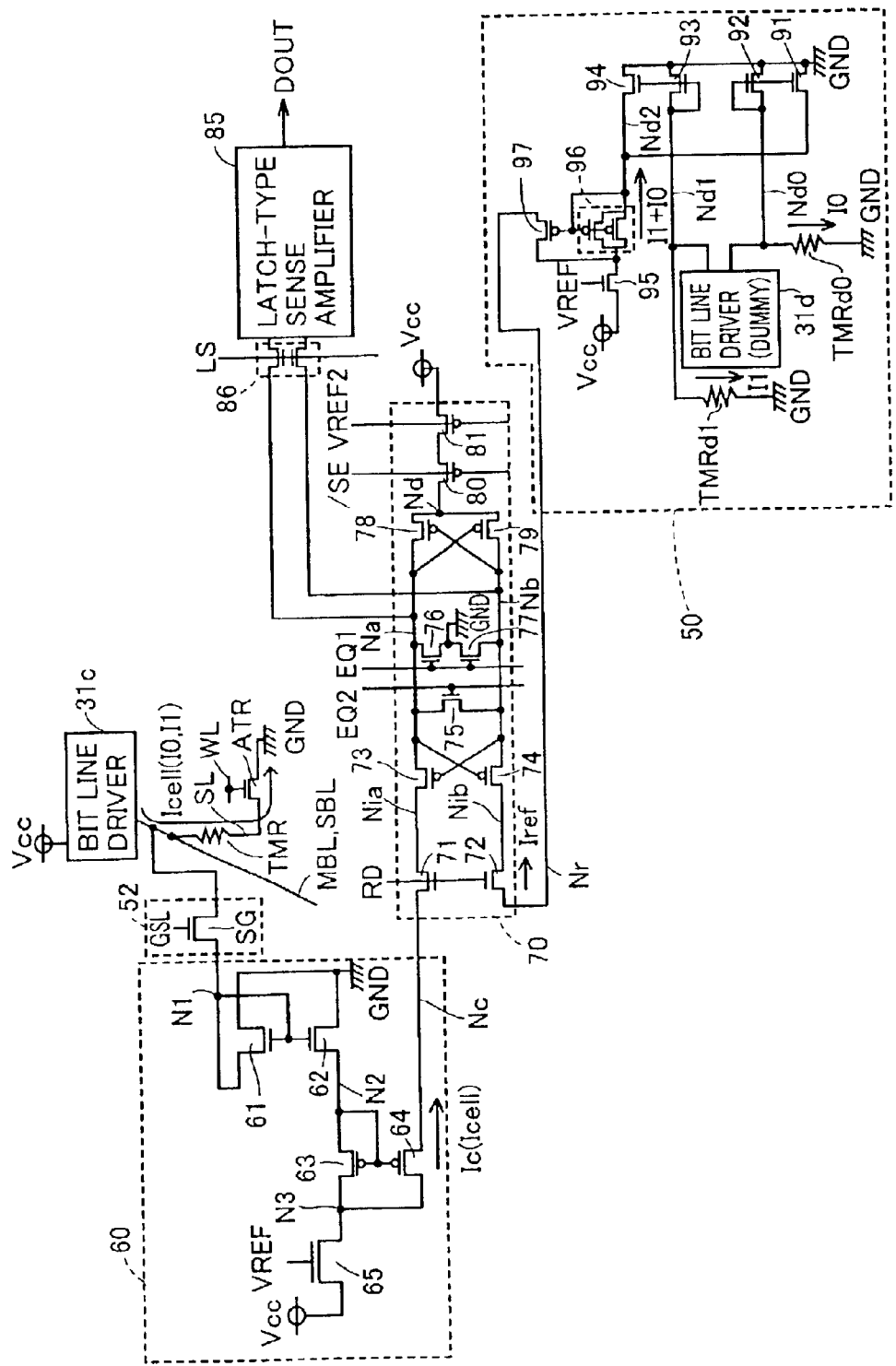
FIG. 9 is a circuit diagram showing the structure of the data read circuit in FIG. 8.

FIG. 9 exemplarily shows the structure of a data read circuit.

Referring to FIG. 9, a bit line driver 31c drives a main bit line MBL corresponding to the selected memory cell to power supply voltage Vcc. In the selected sub array, connection control portions 15 connect a corresponding main bit line MBL and sub bit line SBL to each other. As a result, a memory cell current Icell according to the storage data level of tunneling magneto-resistance element TMR is supplied to the path formed by bit line driver 31c, main bit line MBL, sub bit line SBL, selected memory cell (tunneling magneto-resistance element TMR), strap SL, access transistor ATR and ground voltage GND. It is herein assumed that memory cell current Icell has a value I1 when H level ("1") is stored in tunneling magneto-resistance element TMR, and a value I0 when L level ("0") is stored therein.

Bit line driver 31c may either be provided for every main bit line MBL or every data read circuit 55. In the latter case, main bit line MBL corresponding to the selected memory cell is connected to bit line driver 31c based on the column selection result.

Each data read circuit 55 in FIG. 8 includes a current detector 60, a current sense amplifier 70 and a latch-type sense amplifier 85.

Current detector 60 has a current-mirror structure and generates a detection current Ic according to a memory cell current Icell flowing through the selected memory cell and strap SL.

Current detector 60 includes a node N1 coupled to main bit line MBL through a column selection gate SG, an N-channel MOS transistor 61 provided between node N1 and ground voltage GND, an N-channel MOS transistor 62 provided between a node N2 and ground voltage GND, a P-channel MOS transistor 63 provided between nodes N2, N3, a P-channel MOS transistor 64 provided between nodes N3, Nc, and an N-channel MOS transistor 65 provided between power supply voltage Vcc and node N3.

Main bit line MBL connected to the selected memory cell is coupled to node N1 through column selection gate SG in response to activation of a corresponding column group selection signal GSL. N-channel MOS transistors 61, 62 have their respective gates connected to node N1. P-channel MOS transistors 63, 64 have their respective gates coupled to node N2. A prescribed voltage VREF is applied to the gate of N-channel MOS transistor 65.

Such a current mirror structure enables a detection current Ic to be generated at node Nc according to a memory cell current Icell flowing through main bit line MBL coupled to the selected memory cell. Note that, by adjusting a prescribed voltage VREF to be applied to the gate of N-channel MOS transistor 65, the amplitude of detection current Ic is restricted, whereby a transient current can be prevented from being generated abruptly.

Reference current generator 50 supplies a reference current Iref to a node Nr. Reference current Iref has an intermediate value of two values I1, I0 of memory cell current Icell.

Reference current generator 50 includes dummy tunneling magneto-resistance elements TMRd0, TMRd1 and a bit line driver 31d. Dummy tunneling magneto-resistance element TMRd0 is coupled between a node Nd0 and ground voltage GND. Dummy tunneling magneto-resistance element TMRd1 is coupled between node Nd1 and ground voltage GND. Dummy tunneling magneto-resistance elements TMRd0, TMRd1 have the same structure and characteristics as those of tunneling magneto-resistance elements TMR arranged in a matrix in memory array 10.

Dummy tunneling magneto-resistance element TMRd0 stores L-level ("0") data and dummy tunneling magneto-resistance element TMRd1 stores H-level ("1") data. It is not necessary to rewrite dummy tunneling magneto-resistance elements TMRd0, TMRd1. Therefore, data write operation to the dummy tunneling magneto-resistance elements may be conducted when the power supply of the MRAM device is turned ON.

In data read operation, bit line driver 31d drives nodes Nd0, Nd1 to power supply voltage Vcc. As a result, currents I0, I1 flow through dummy tunneling magneto-resistance elements TMRd0, TMRd1.

Reference current generator 50 further includes a transistor 91 provided between a node Nd2 and ground voltage GND, a transistor 92 provided between node Nd0 and ground voltage GND, a transistor 93 provided between node Nd1 and ground voltage GND, and a transistor 94 provided between node Nd2 and ground voltage GND. Transistors 91, 92 have their respective gates coupled to node Nd0. Transistors 93, 94 have their respective gates coupled to node Nd1. N-channel MOS transistors are used as transistors 91 to 94 of reference current generator 50.

Reference current generator 50 further includes transistors 95, 96 coupled in series between power supply voltage Vcc and node Nd2, and a P-channel MOS transistor 97 provided between transistor 95 and node Nr. P-channel MOS transistors are used as transistors 96, 97 of reference current generator 50.

Like N-channel MOS transistor 65 in current detector 60, a prescribed voltage VREF is applied to the gate of N-channel MOS transistor 95. The current driving capability of transistor 96 is twice that of transistor 97.

Transistors 91, 94 each forming a current mirror with respective transistors 92, 93 allows a current (I0+I1) to be supplied to node Nd2. Since the current driving capability of transistor 96 is twice that of transistor 97, a reference current Iref=(I0+I1)/2 can be supplied to node Nr. In other words, transistors 91 to 97 in reference current generator 50 enables an average current of currents I0, I1 flowing through dummy tunneling magneto-resistance elements TMRd0, TMRd1 to be output. Note that the current driving capability of transistor 96 may be k times that of transistor 97 (where k is a real number greater than 1).

Current sense amplifier 70 includes two input nodes Nia, Nib, N-channel MOS transistors 71, 72 provided between input nodes Nia, Nib and nodes Nc, Nr, respectively, a P-channel MOS transistor 73 provided between input node Nia and node Na, and a P-channel MOS transistor 74 provided between input node Nib and node Nb.

A control signal RD is applied to the respective gates of N-channel MOS transistors 71, 72. Control signal RD is activated at the same timing as that of word line WL. P-channel MOS transistor 73 has its gate coupled to node Nb. P-channel MOS transistor 74 has its gate coupled to node Na.

Current sense amplifier 70 further includes an N-channel MOS transistor 75 provided between nodes Na, Nb, and N-channel MOS transistors 76, 77 provided between nodes Na, Nb and ground voltage GND, respectively. A control signal EQ1 is applied to the respective gates of N-channel MOS transistors 76, 77, and a control signal EQ2 is applied to the gate of N-channel MOS transistor 75.

Transistors 76, 77 connect or disconnect nodes Na, Nb to or from ground voltage GND in response to control signal EQ1. Transistor 75 equalizes the voltages on nodes Na, Nb in response to control signal EQ1.

Current sense amplifier 70 further includes P-channel MOS transistors 78, 79 provided between nodes Na, Nb and node Nd, respectively, and P-channel MOS transistors 80, 81 connected in series between node Nd and power supply voltage Vcc.

P-channel MOS transistor 78 has its gate coupled to node Nb and P-channel MOS transistor 79 has its gate coupled to node Na. A sense enable signal /SE is applied to the gate of P-channel MOS transistor 80. A prescribed voltage VREF2 is applied to the gate of P-channel MOS transistor 81. By appropriately setting prescribed voltage VREF2, the voltage amplitude of nodes Na, Nb is restricted.

P-channel MOS transistors 73, 74 and 78, 79 operate as a cross-coupled amplifier. By P-channel MOS transistors 73, 74 and 78, 79, the voltage difference corresponding to the current difference between input nodes Nia, Nib, that is, the difference between detection current Ic and reference current Iref, is generated between nodes Na, Nb.

Data read circuit 55 further includes a transmission gate 86 between nodes Na, Nb and latch-type sense amplifier 85. Transmission gate 86 connects or disconnects latch-type sense amplifier 85 to or from nodes Na, Nb in response to a latch signal LS. Latch signal LS is set to L level at a prescribed timing after data read operation is started. As a result, the voltages on nodes Na, Nb are latched in latch-type sense amplifier 85 at the prescribed timing. Latch-type sense amplifier 85 produces read data DOUT according to the latched voltages.

Hereinafter, data read operation of data read circuit 55 will be described.

Figure 10:
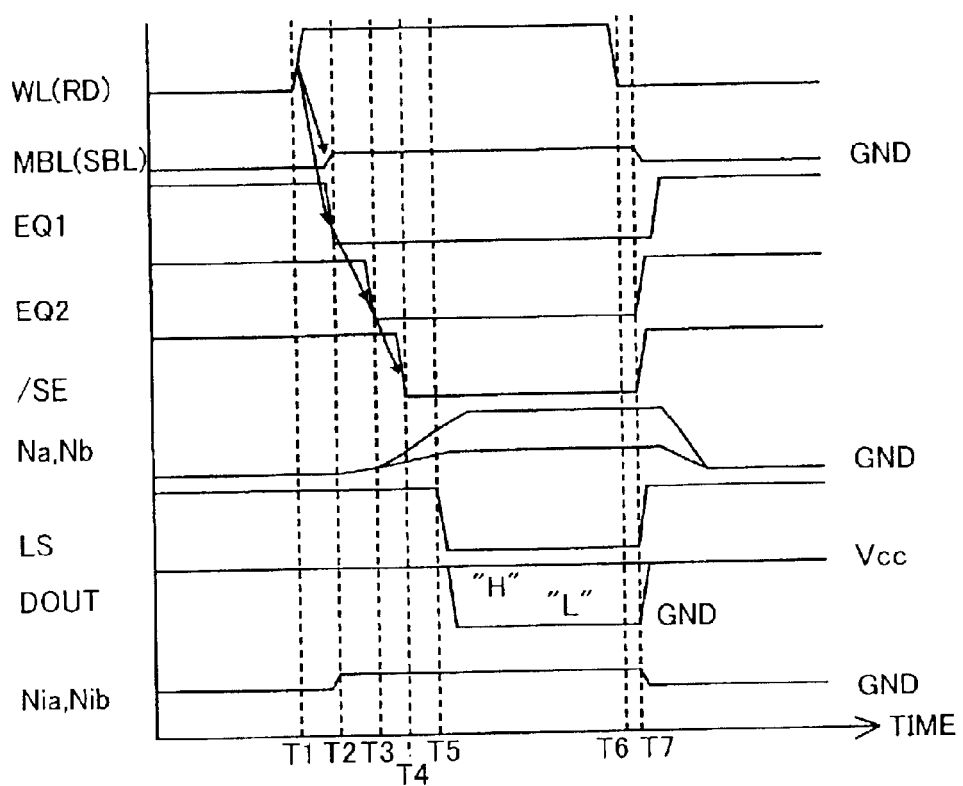
FIG. 10 is a waveform chart illustrating data read operation according to the first embodiment.

Referring to FIG. 10, data read operation is started at time T1. Before time T1, control signal RD is set to L level, and control signals EQ1, EQ2 and sense enable signal /SE are set to H level. As a result, input nodes Nia, Nib are disconnected from node Nc for transmitting detection current Ic and node Nr for transmitting reference current Iref. Nodes Na, Nb are connected to ground voltage GND through transistors 76, 77.

At time T1, data read operation is started, and word line WL corresponding to the selected row is activated as well as control signal RD is activated to H level. In response to this, the selected memory cell is electrically coupled between man bit line MBL and ground voltage GND. Nodes Nc, Nr are electrically coupled to input nodes Nia, Nib, respectively.

At time T2, bit line driver 31c drives main bit line MBL (sub bit line SBL) corresponding to the selected memory cell to power supply voltage Vcc, and control signal EQ1 falls to L level. In response to this, a memory cell current Icell according to the storage data level is supplied to the selected memory cell. Current detector 60 outputs a detection current Ic according to memory cell current Icell to input node Nia through N-channel MOS transistor 71. A reference current Iref is applied to input node Nib.

With transistor 75 retained in the ON state, nodes Na, Nb are disconnected from ground voltage GND by transistors 76, 77. As a result, the voltages on nodes Na, Nb gradually rise according to detection current Ic and reference current Iref while being equalized by transistor 75.

At time T3, control signal EQ2 is set to L level, whereby transistor 75 is turned OFF. As a result, the voltage difference corresponding to the difference between detection current Ic and reference current Iref is generated between nodes Na, Nb from time T3.

In this state, sense enable signal /SE is activated to L level at time T4, whereby a constant current is supplied from power supply voltage Vcc to node Nd. As a result, the cross-coupled amplifiers formed by P-channel MOS transistors 73, 74 and 78, 79 amplify the voltage difference between nodes Na, Nb.

The constant current from power supply voltage Vcc is adjustable by gate voltage VREF2 of P-channel MOS transistor 81. Moreover, since detection current Ic is produced by current detector 60, main bit line MBL will not be subjected to a current backflow.

After the voltage difference between nodes Na, Nb is thus amplified, latch signal LS falls to L level at time T5. In response to this, latch-type sense amplifier 85 latches the voltages on nodes Na, Nb at time T5. Latch-type sense amplifier 85 amplifies the voltage difference between nodes Na, Nb and sets read data DOUT to either H level (power supply voltage Vcc) or L level (ground voltage GND).

At the end of the data read operation, word line WL corresponding to the selected memory cell and control signal RD are inactivated at time T6. At time T7, control signal EQ2 and sense enable signal /SE rise to H level. Latch signal LS also rises to H level. Thereafter, control signal EQ1 is set to H level to turn ON transistors 76, 77. As a result, the operation state returns to the state before data read operation.

Data read operation is thus conducted based on comparison between a memory cell current Icell flowing through the selected memory cell and a reference current Iref. This enables improvement in read operation speed.

Reference current generator 50 is capable of generating a reference current Iref by using the tunneling magneto-resistance elements having the same structure as that of memory cells. In particular, tunneling magneto-resistance elements TMR of MTJ memory cells and dummy tunneling magneto-resistance elements TMRd0, TMRd1 can be fabricated on the same MRAM device on the same manufacturing conditions. Accordingly, tunneling magneto-resistance elements TMR and dummy tunneling magneto-resistance elements TMRd0, TMRd1 are expected to have the same manufacturing variation. Accordingly, even if memory cell currents I1, I0 according to the storage data level vary due to the manufacturing variation of tunneling magneto-resistance elements TMR, reference current Iref can be accurately set to an intermediate value of I1 and I0.

Modification of First Embodiment

Figure 11:
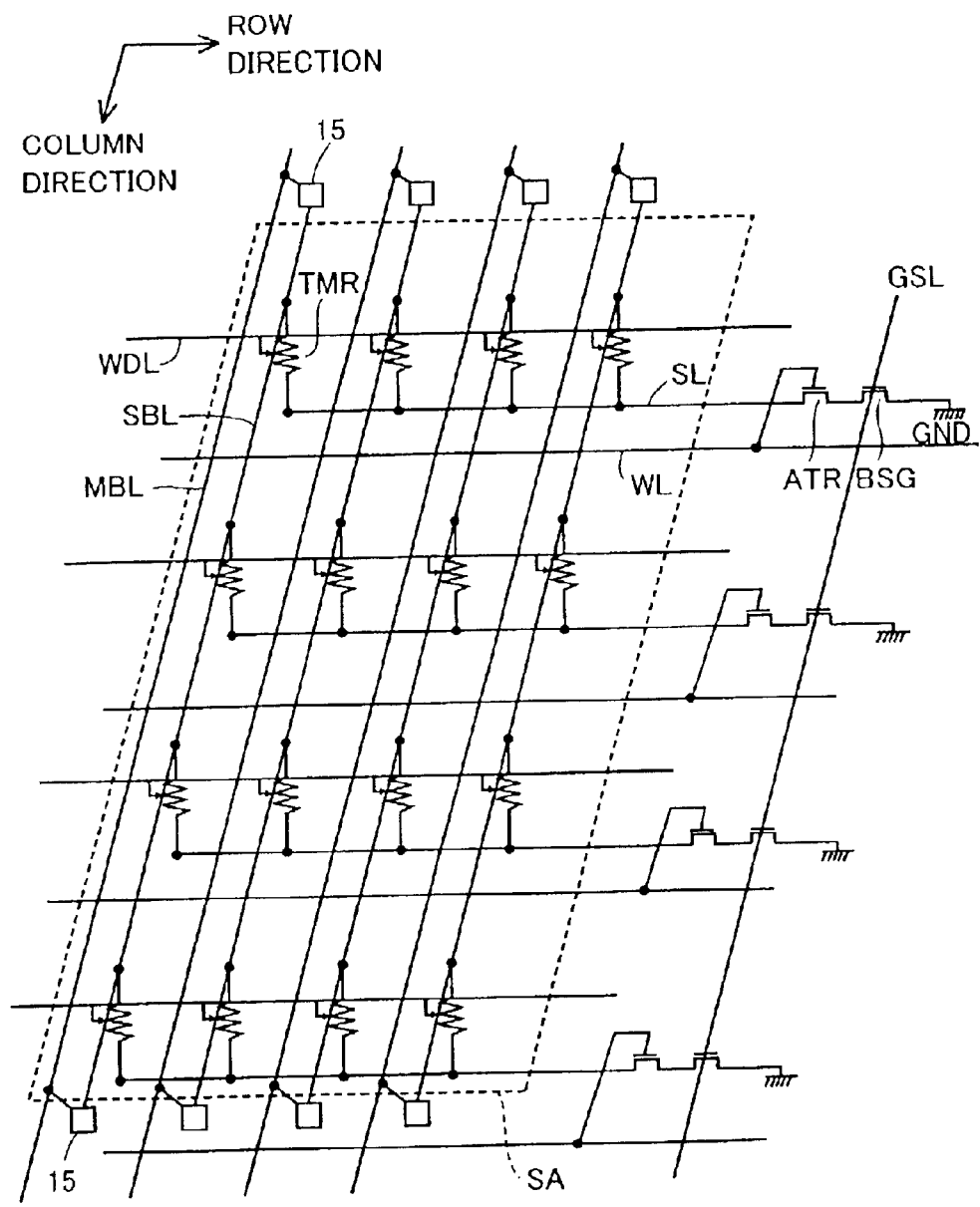
FIG. 11 is a circuit diagram showing the structure of a sub array according to a modification of the first embodiment.

Referring to FIG. 11, the modification of the first embodiment is different from the first embodiment in FIG. 3 in that the modification of the first embodiment further includes selection gates BSG. Each selection gate BSG is connected in series with a corresponding access transistor ATR between a corresponding strap SL and ground voltage GND.

A column group selection signal GSL is applied to the gate of selection gate BSG. As described before, one of M straps SL corresponding to a single word line WL is selected according to column group selection signal GSL.

With this structure, only a selection gate BSG corresponding to the selected memory cell is turned ON when a word line WL of the selected row is activated and a plurality of (M) corresponding access transistors ATR are turned ON. Therefore, straps SL that are not coupled to the selected memory cell can be retained in the floating state without being coupled to ground voltage GND.

According to the modification of the first embodiment, an unnecessary leak current can be prevented from flowing through straps SL corresponding to the non-selected memory cells even when each strap SL is shared by a plurality of memory cells in the row direction. This enables implementation of stable data read operation and reduced current consumption.

Second Embodiment

The second embodiment is intended to further improve the read operation speed by directly using a memory cell current Icell flowing through the selected memory cell.

Figure 12:
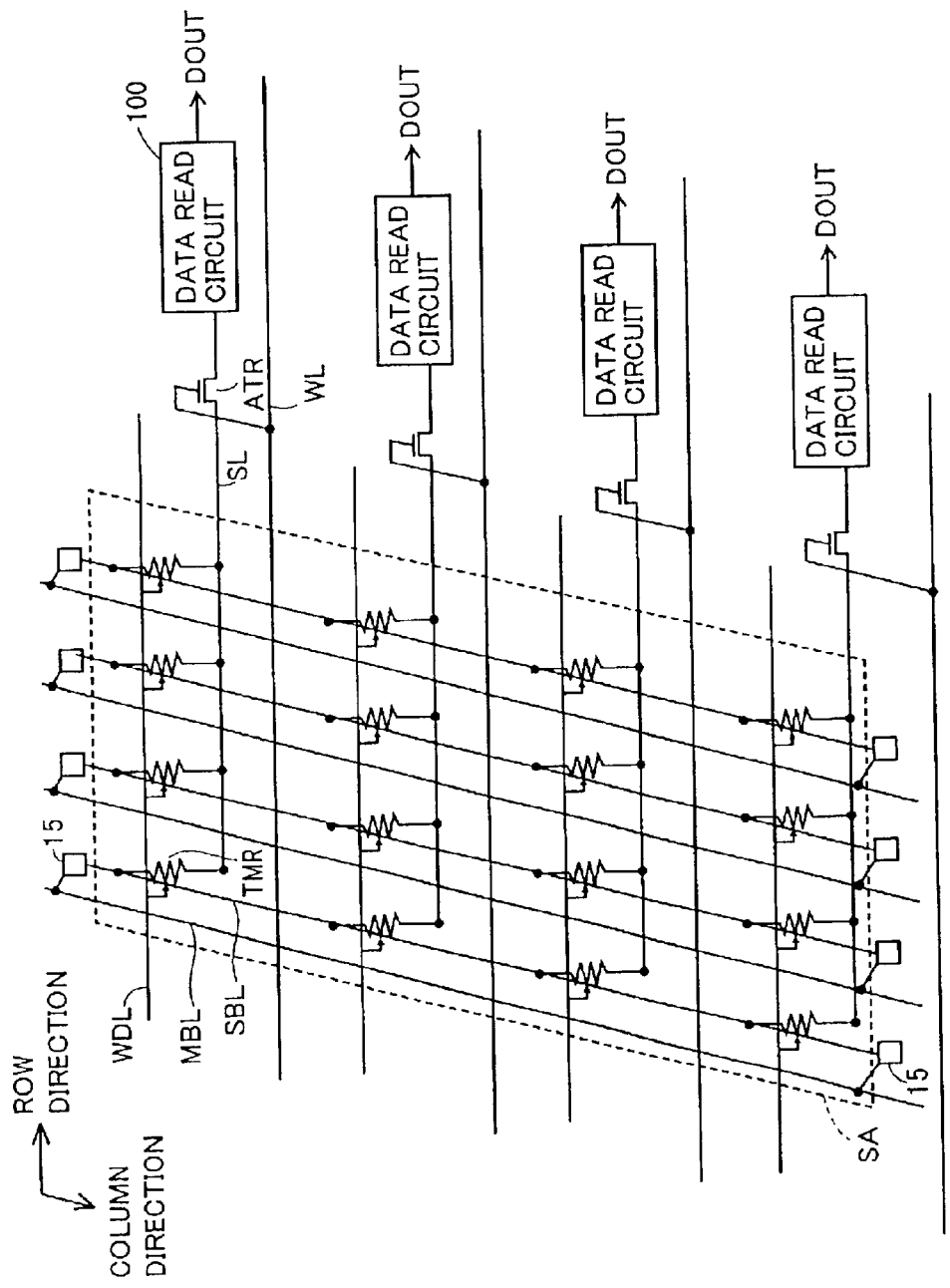
FIG. 12 is a block diagram showing arrangement of data read circuits according to a second embodiment of the present invention.

Referring to FIG. 12, a data read circuit 100 of the second embodiment is provided for every strap SL. In each sub array, an access transistor ATR is provided between strap SL and data read circuit 100 in every memory cell row. Each access transistor ATR has its gate coupled to a corresponding word line WL. Since arrangement of tunneling magneto-resistance elements TMR, sub bit lines SBL, straps SL and write digit lines WDL in each sub array SA is the same as that of the first embodiment in FIG. 3, detailed description thereof will not be repeated.

In the second embodiment, single read data DOUT can be produced from a single strap SL. Accordingly, of L (four) main bit lines MBL corresponding to the selected memory array, a main bit line MBL corresponding to the selected memory cell is set to ground voltage GND, whereas the remaining main bit lines MBL (sub bit lines SBL) corresponding to the non-selected memory cells are set to a negative voltage Vnn. Negative voltage Vnn will be described later.

As a result, the selected memory cell is electrically coupled between a corresponding main bit line MBL (sub bit line SBL) thus set to ground voltage GND and a corresponding data read circuit 100 through a corresponding access transistor ATR and strap SL.

Figure 13:
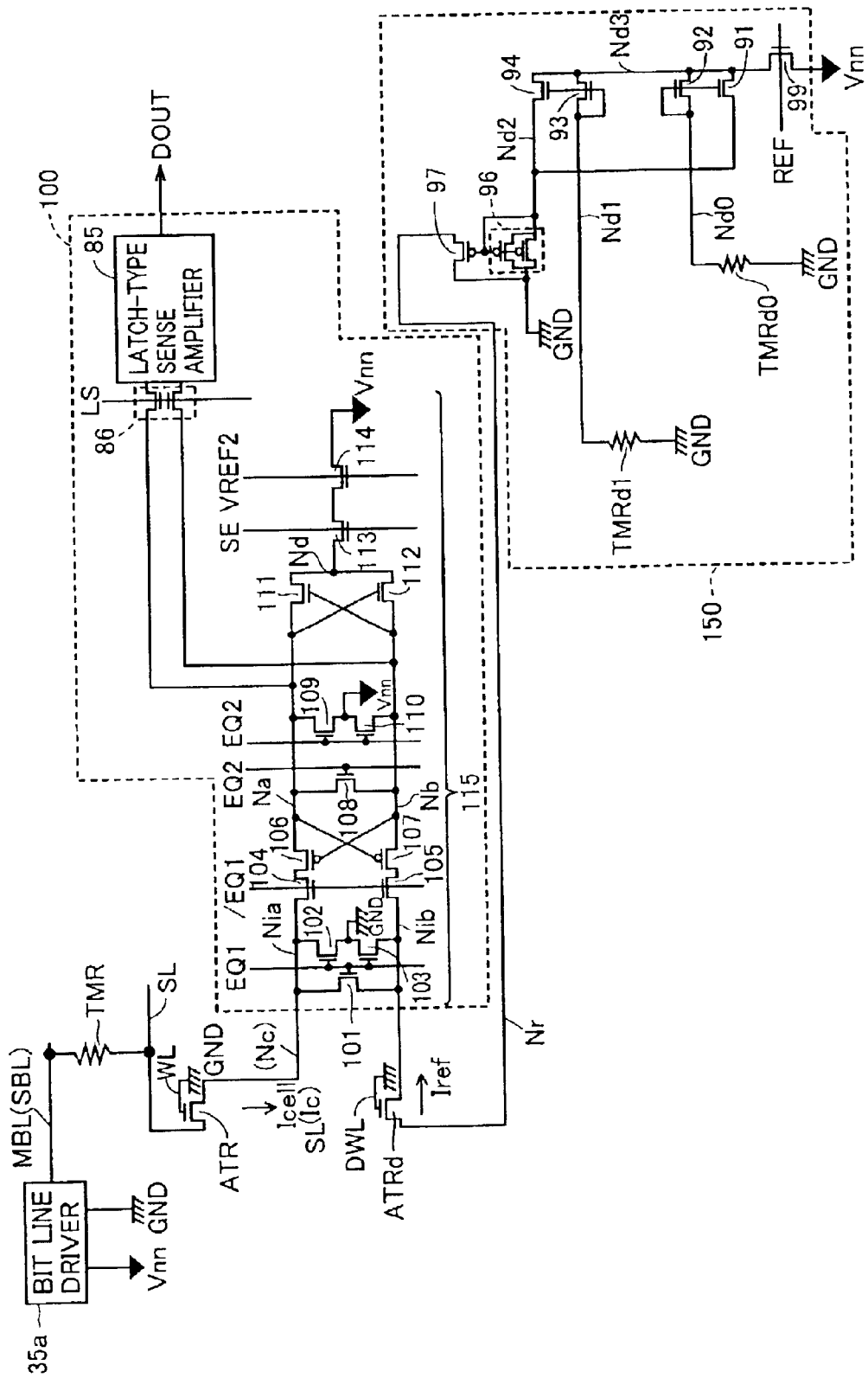
FIG. 13 is a circuit diagram showing the structure of the data read circuit according to the second embodiment.

Referring to FIG. 13, data read circuit 100 of the second embodiment includes a latch-type sense amplifier 85 and a strap driving portion 115. In data read operation, strap driving portion 115 drives a corresponding strap SL with a negative voltage Vnn and produces read data DOUT according to the difference between a memory cell current Icell flowing through the selected memory cell and a reference current Iref. In order to turn ON an access transistor ATR corresponding to the selected memory cell, negative voltage Vnn must be set to "Vnn<GND−Vt", where Vt is a threshold voltage of access transistor ATR.

Strap driving portion 115 includes an N-channel MOS transistor 101 provided between input nodes Nia, Nib, and N-channel MOS transistors 102, 103 provided between input nodes Nia, Nib and ground voltage GND, respectively. A control signal EQ1 is applied to the respective gates of N-channel MOS transistors 101 to 103.

N-channel MOS transistors 101 to 103 equalize the voltages on input nodes Nia, Nib (i.e., connect input nodes Nia, Nib to ground voltage GND) in response to activation of control signal EQ1. In the period other than the equalizing operation, N-channel MOS transistors 101 to 103 disconnect input nodes Nia, Nib from ground voltage GND.

Strap driving portion 115 further includes an N-channel MOS transistor 104, a P-channel MOS transistor 106, an N-channel MOS transistor 105 and a P-channel MOS transistor 107. N-channel MOS transistor 104 and P-channel MOS transistor 106 are connected in series between input node Nia and node Na. N-channel MOS transistor 105 and P-channel MOS transistor 107 are connected in series between input node Nib and node Nb. An inverted signal /EQ1 of control signal EQ1 is applied to the respective gates of N-channel MOS transistors 104, 105. P-channel MOS transistor 106 has its gate coupled to node Nb, and P-channel MOS transistor 107 has its gate coupled to node Na. Input nodes Nia, Nib are electrically disconnected from nodes Na, Nb during the active period of control signal EQ1, that is, during the operation of equalizing the voltages on input nodes Nia, Nib.

Strap driving portion 115 further includes an N-channel MOS transistor 108 provided between nodes Na, Nb and N-channel MOS transistors 109, 110 provided between nodes Na, Nb and negative voltage Vnn, respectively. A control signal EQ2 is applied to the respective gates of N-channel MOS transistors 108 to 110.

N-channel MOS transistors 108 to 110 equalize the voltages on nodes Na, Nb (i.e., connect nodes Na, Nb to negative voltage Vnn) in response to activation of control signal EQ2. In the period other than the equalizing operation, N-channel MOS transistors 108 to 110 disconnect nodes Na, Nb from negative voltage Vnn.

Strap driving portion 115 further includes an N-channel MOS transistor 111 provided between nodes Nd, Na, an N-channel MOS transistor 112 provided between nodes Nd, Nb, and N-channel MOS transistors 113, 114 connected in series between node Nd and negative voltage Vnn.

N-channel MOS transistor 111 has its gate coupled to node Nb. N-channel MOS transistor 112 has its gate coupled to node Na. A sense enable signal SE is applied to the gate of transistor 113, and a prescribed voltage VREF2 is applied to the gate of N-channel MOS transistor 114.

P-channel MOS transistors 106, 107 and N-channel MOS transistors 111, 112 operate as a cross-coupled amplifier. By P-channel MOS transistors 106, 107 and N-channel MOS transistors 111, 112, the voltage difference corresponding to the current difference between input nodes Nia, Nib, that is, the difference between a detection current Ic and a reference current Iref, is generated between nodes Na, Nb.

A transmission gate 86 is provided between latch-type sense amplifier 85 and nodes Na, Nb. Transmission gate 86 connects or disconnects nodes Na, Nb to or from latch-type sense amplifier 85 in response to a latch signal LS.

In the second embodiment, reference current generator 50 of the first embodiment is replaced with a reference current generator 150. Reference current generator 150 has a structure similar to that of reference current generator 50 in FIG. 9, and includes dummy tunneling magneto-resistance elements TMRd0, TMRd1, transistors 91, 92, 93, 94, 96, 97 and an N-channel MOS transistor 99.

In reference current generator 150, N-channel MOS transistors are used as transistors 91 to 94, and P-channel MOS transistors are used as transistors 96, 97.

Transistors 96, 97 are provided between ground voltage GND and nodes Nd2, Nr, respectively. Transistors 91, 92, 93, 94 are connected to a node Nd3. Node Nd3 is electrically coupled to negative voltage Vnn through N-channel MOS transistor 99.

Reference current generator 150 thus produces the same reference current Iref as that of reference current generator 50 when data read circuit 100 drives strap SL to negative voltage Vnn in data read operation.

A control signal REF applied to the gate of N-channel MOS transistor 99 is activated to H level only in data read operation. As a result, reference current Iref will not be produced in the period other than the data read operation, whereby unnecessary current consumption can be prevented.

A bit line driver 35a is provided for every main bit line MBL. Bit line driver 35a drives a main bit line MBL of the selected column to ground voltage GND according to the column selection result, and drives main bit lines MBL of the non-selected columns to negative voltage Vnn. In data read operation, each word line WL is set to ground voltage GND. Accordingly, a memory cell current Icell flowing through a tunneling magneto-resistance element TMR of the selected memory cell is directly applied to input node Nia.

On the other hand, in data read operation, a dummy world line DWL is set to ground voltage GND, whereby a dummy access transistor ATRd is turned ON. As a result, a reference current Iref from reference current generator 150 is applied to the other input node Nib through dummy access transistor ATRd.

Hereinafter, data read operation according to the second embodiment will be described.

Figure 14:
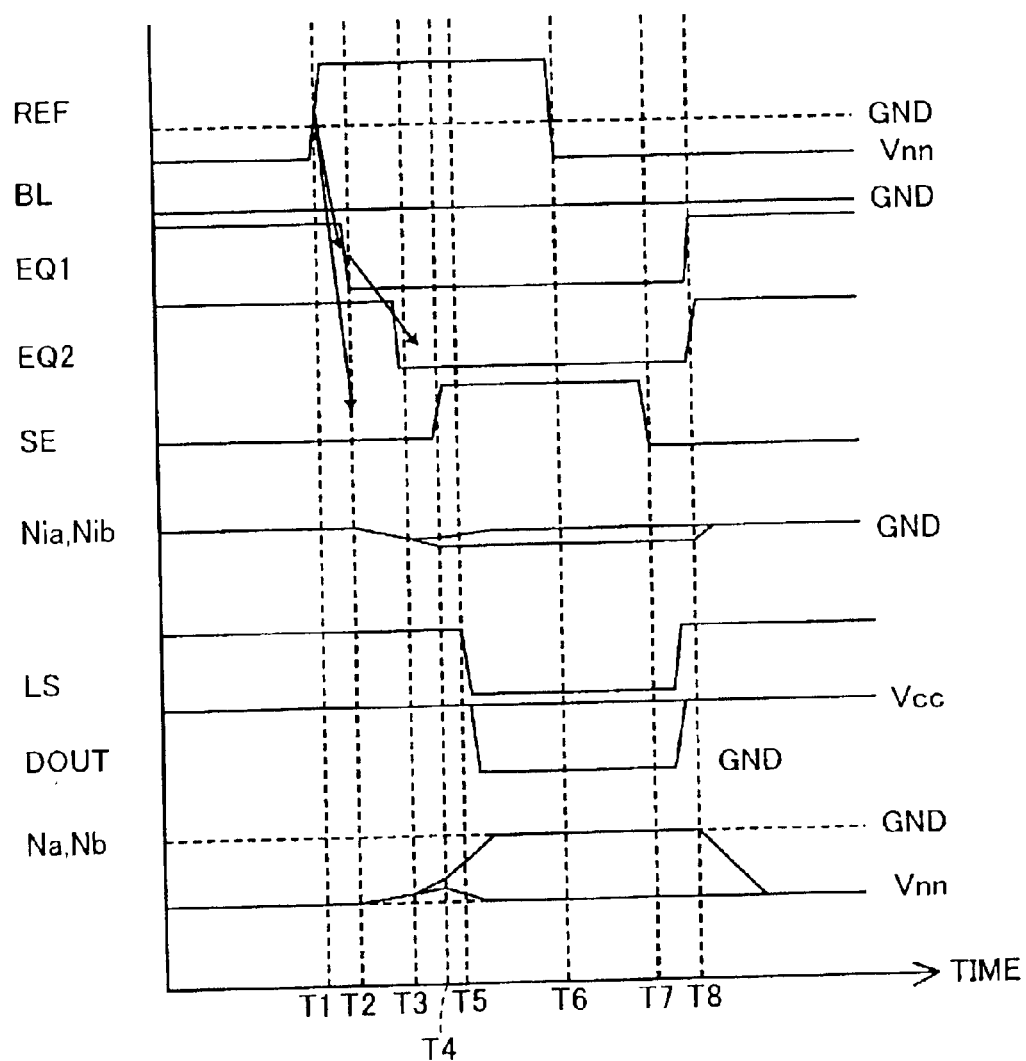
FIG. 14 is a waveform chart illustrating data read operation according to the second embodiment.

Referring to FIG. 14, data read operation is started at time T1. Before time T1, control signals EQ1, EQ2 and latch signal LS are set to H level, and sense enable signal SE is set to L level. Accordingly, input nodes Nia, Nib are connected to ground voltage GND, and nodes Na, Nb are connected to negative voltage Vnn.

At time T1, data read operation is started and control signal REF is activated to H level. In response to this, reference current generator 150 starts supplying reference current Iref to input node Nib.

At time T2, control signal EQ1 is set to L level. As a result, operation of equalizing the voltages on input nodes Nia, Nib is discontinued, and input nodes Nia, Nib are disconnected from ground voltage GND. Moreover, N-channel MOS transistors 104, 105 are turned ON in response to control signal EQ1. As a result, input nodes Nia, Nib are discharged from ground voltage GND toward negative voltage Vnn through N-channel MOS transistors 109, 110. As a result, the voltages on input nodes Nia, Nib gradually fall from ground voltage GND. On the other hand, the voltages on nodes Na, Nb rise from the precharge voltage, that is, negative voltage Vnn. N-channel MOS transistor 108 is in the ON state at this timing. Therefore, nodes Na, Nb are set to the same voltage.

Although not shown in the figure, main bit lines MBL of the non-selected columns are driven to negative voltage Vnn through respective bit line drivers 35a. Accordingly, no memory cell current will flow through the non-selected memory cells connected to the same strap as the selected memory cell.

At time T3, control signal EQ2 is set to L level. In response to this, nodes Na, Nb are disconnected from each other. Therefore, the voltage difference corresponding to the difference between memory cell current Icell and reference current Iref appears between nodes Na, Nb.

At time T4, sense enable signal SE is activated to H level, whereby a constant current according to prescribed voltage VREF2 is drawn from node Nd to negative voltage Vnn. As a result, the cross-coupled amplifier formed by N-channel MOS transistors 111, 112 amplifies the voltage difference between nodes Na, Nb toward ground voltage GND and negative voltage Vnn.

After the voltage difference between nodes Na, Nb is amplified, latch signal LS is set to L level at time T5. As a result, the voltage difference between nodes Na, Nb can be latched in latch-type sense amplifier 85 at this timing. Latch-type sense amplifier 85 amplifies the latched voltage difference between nodes Na, Nb and sets read data DOUT to either H level (power supply voltage Vcc) or L level (ground voltage GND).

Reference current Iref need no longer be supplied after latch-type sense amplifier 85 latches the voltages on nodes Na, Nb at the prescribed timing. Accordingly, control signal REF is inactivated to L level at time T6 in order to discontinue supply of reference current Iref. Sense enable signal SE is inactivated at time T7 and control signals EQ1, EQ2 are restored to H level. As a result, the operation state returns to that before data read operation.

In this way, data read operation can be conducted by directly using a memory cell current Icell flowing through the selected memory cell. As a result, the read operation speed can further be improved. Moreover, since nodes Na, Nb are precharge to negative voltage Vnn, a special drive circuit need not be provided to drive strap SL to negative voltage Vnn after the data read operation is started. In other words, strap SL can be driven to negative voltage Vnn by using the transistors for equalizing the voltages on nodes Na, Nb. As a result, the structure of the data read circuit is simplified.

Modification of Second Embodiment

Figure 15:
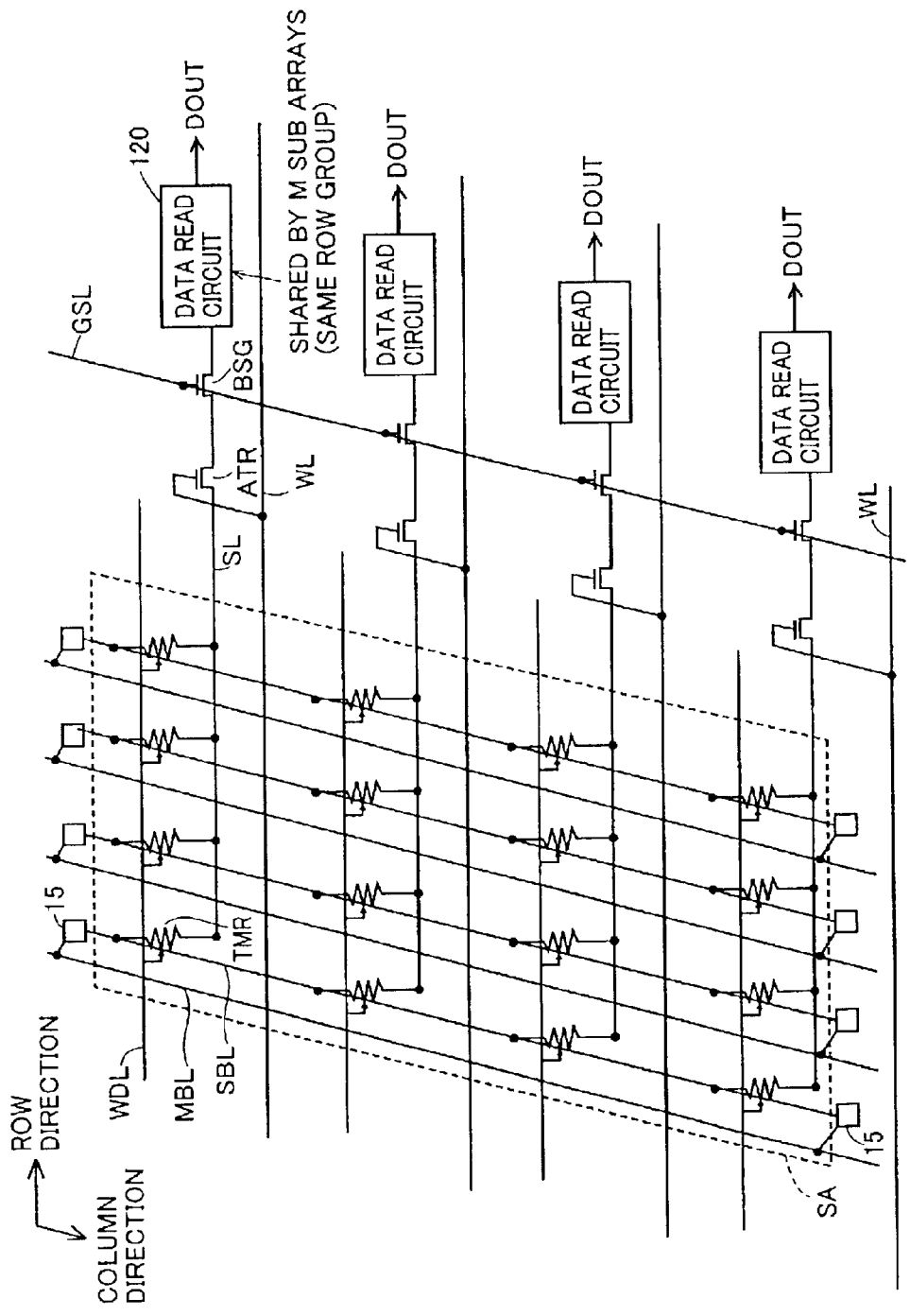
FIG. 15 is a block diagram showing arrangement of data read circuits according to a modification of the second embodiment.

Referring to FIG. 15, a data read circuit 120 according to the modification of the second embodiment is provided for every memory cell row. In other words, each data read circuit 120 is shared by M sub arrays of the same row group. Each data read circuit 120 is electrically coupled to each strap SL through a corresponding access transistor ATR and selection gate BSG.

A column group selection signal GSL is applied to the gate of selection gate BSG. One of M straps SL corresponding to a single word line WL is selected by column group selection signal GSL. Accordingly, in the selected row (i.e., the row corresponding to an activated word line WL), only the strap corresponding to the selected memory cell is connected to data read circuit 120. Since each data read circuit 120 is shared by M sub arrays of the same row group, the number of data read circuits 120 can be reduced.

Figure 16:
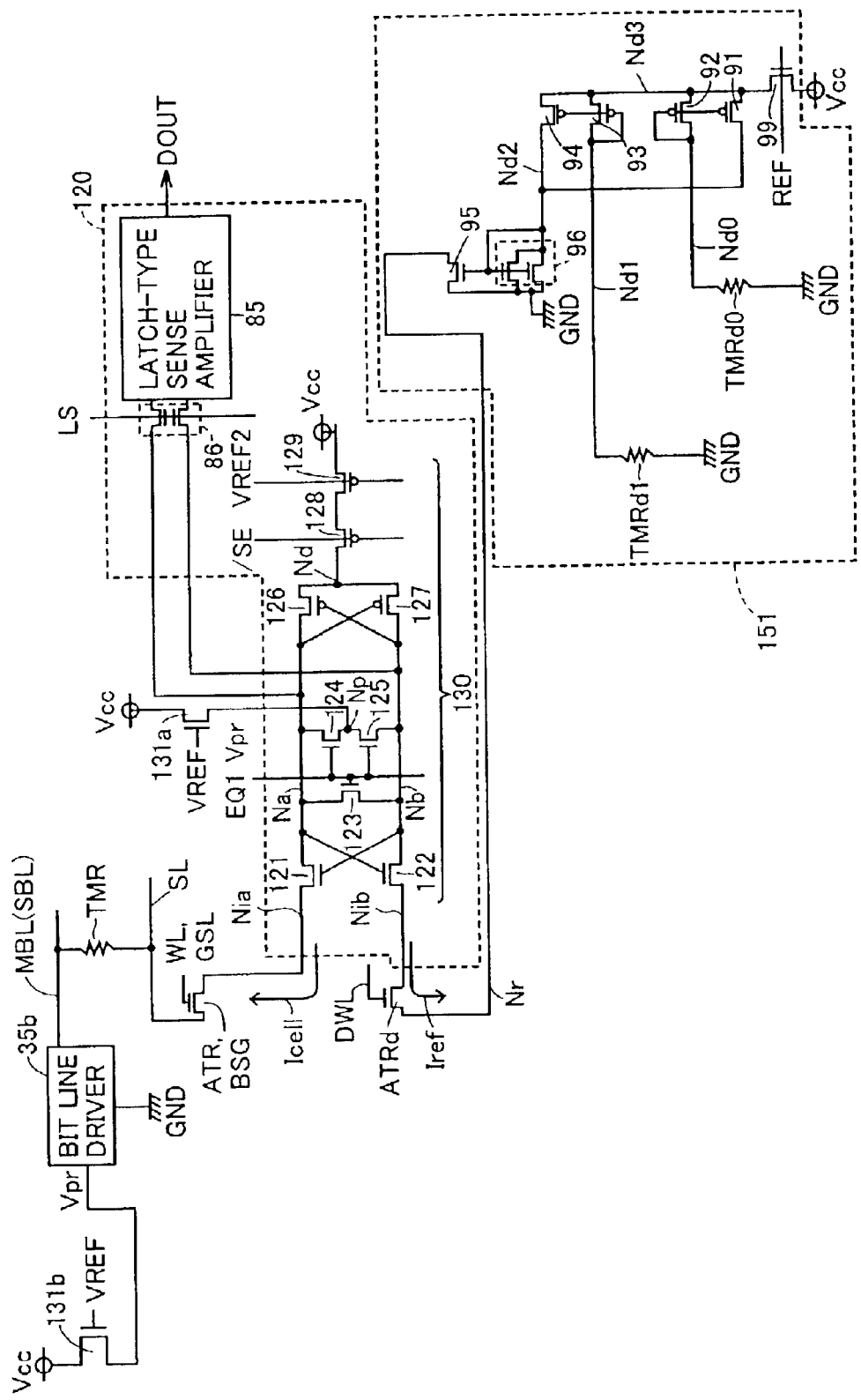
FIG. 16 is a circuit diagram showing the structure of the data read circuit according to the modification of the second embodiment.

Referring to FIG. 16, data read circuit 120 includes a latch-type sense amplifier 85 and a strap driving portion 130.

Strap driving portion 130 includes an N-channel MOS transistor 121 provided between input node Nia and node Na, and an N-channel MOS transistor 122 provided between input node Nib and node Nb. N-channel MOS transistor 121 has its gate coupled to node Nb. N-channel MOS transistor 122 has its gate coupled to node Na.

Strap driving portion 130 further includes an N-channel MOS transistor 123 provided between nodes Na, Nb, and N-channel MOS transistors 124, 125 provided between a precharge node Np and nodes Na, Nb, respectively. A control signal EQ1 is applied to the respective gates of N-channel MOS transistors 123 to 125.

Precharge node Np is electrically coupled to power supply voltage Vcc through an N-channel MOS transistor 131a. N-channel MOS transistor 131a receives a prescribed voltage VREF at its gate. Accordingly, precharge node Np is set to a prescribed precharge voltage Vpr.

N-channel MOS transistors 123 to 125 equalize the voltages on nodes Na, Nb (i.e., sets nodes Na, Nb to precharge voltage Vpr) in response to activation (H level) of control signal EQ1.

Strap driving portion 130 further includes a P-channel MOS transistor 126 provided between nodes Na, Nd, a P-channel MOS transistor 127 provided between nodes Nb, Nd, and P-channel MOS transistors 128, 129 connected in series between node Nd and power supply voltage Vcc.

P-channel MOS transistor 126 has its gate coupled to node Nb. P-channel MOS transistor 127 has its gate coupled to node Na. A sense enable signal /SE is applied to the gate of P-channel MOS transistor 128. P-channel MOS transistor 129 has its gate coupled to a prescribed voltage VREF2.

P-channel MOS transistors 121, 122 and 126, 127 each operate as a cross-coupled amplifier. By P-channel MOS transistors 121, 122 and 126, 127, the voltage difference according to the current difference between input nodes Nia, Nib, that is, the difference between memory cell current Icell and reference current Iref, is generated between nodes Na, Nb.

Like data read circuits 85, 100, a transmission gate 86 is provided between latch-type sense amplifier 85 and nodes Na, Nb.

Reference current generator 151 has similar structure as that of reference current generator 150 in FIG. 13. Since strap SL is driven by power supply voltage Vcc, strap driving portion 130 operates with power supply voltage Vcc rather than negative voltage Vnn. Since the structure of reference current generator 151 is otherwise the similar as that of FIG. 13, detailed description thereof will not be repeated. With this structure, the same reference current Iref as that of reference current generators 50, 150 can be drawn from input node Nib.

In the modification of the second embodiment, a bit line driver 35b is provided for every main bit line MBL. An N-channel MOS transistor 131b is provided between bit line driver 35b and power supply voltage Vcc. The same prescribed voltage VREF as that of N-channel MOS transistor 131a is applied to the gate of N-channel MOS transistor 131b. As a result, bit line driver 35b operates with precharge voltage Vpr of nodes Na, Nb and ground voltage GND. In other words, bit line driver 35b sets main bit line MBL of the selected column to ground voltage GND and main bit lines MBL of the non-selected columns to precharge voltage Vpr.

Strap SL is electrically coupled to input node Nia of strap driving portion 130 through access transistor ATR and selection gate BSG. The other input node Nib is electrically coupled to node Nr through dummy access transistor ATRd. Dummy access transistor ATRd has its gate coupled to a dummy word line DWL.

Hereinafter, data read operation according to the modification of the second embodiment will be described.

Figure 17:
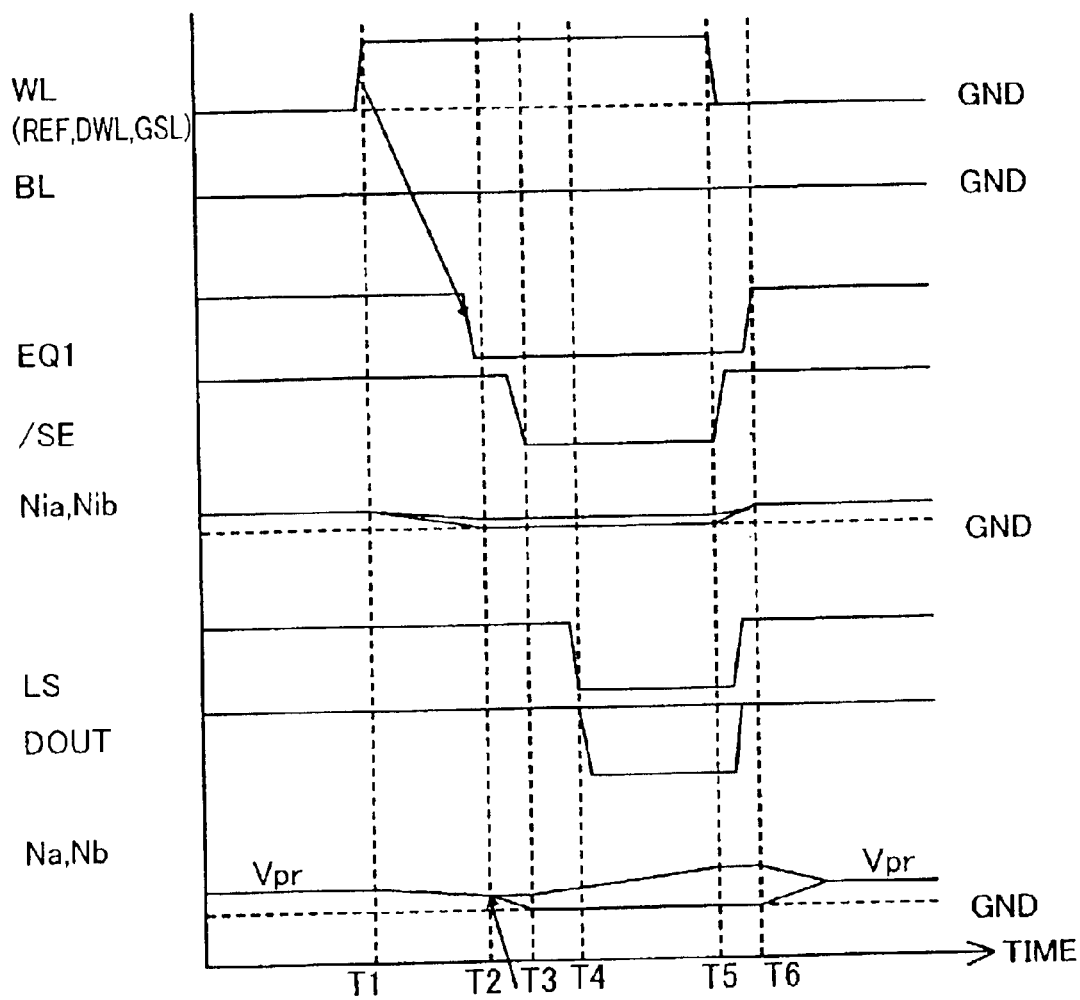
FIG. 17 is a waveform chart illustrating data read operation according to the modification of the second embodiment.
Figure 18:
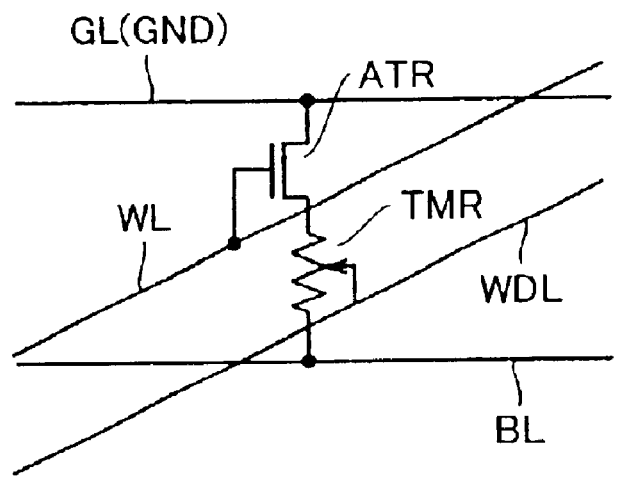
FIG. 18 schematically shows the structure of a memory cell having a magnetic tunnel junction.

Referring to FIG. 17, data read operation is started at time T1. Before time T1, word line WL, control signal REF, dummy word line DWL and column group selection signal GSL are inactivated to L level. Accordingly, strap SL is electrically disconnected from input node Nia, and input node Nib is electrically disconnected from node Nr. Before time T1, reference current generator 151 does not produce a reference current Iref.

Before time T1, control signal EQ1, sense enable signal /SE and latch signal LS are set to H level. Accordingly, nodes Na, Nb are set to precharge voltage Vpr by transistors 123 to 125.

At time T1, data read operation is started and a word line WL of the selected row is activated to H level. At the same time, dummy word line DWL and a column group selection signal GSL corresponding to the selected column group are also activated to H level. As a result, input nodes Nia, Nib are electrically coupled to strap SL and node Nr, respectively. Reference current generator 150 starts generating reference current Iref.

Accordingly, memory cell current Icell according to the storage data level of the selected memory cell starts flowing across input node Nia toward strap SL. Reference current Iref also starts flowing across input node Nib toward node Nr.

As a result, the voltages on input nodes Nia, Nib start falling according to memory cell current Icell and reference current Iref, respectively. The voltages on nodes Na, Nb also start falling from precharge voltage Vpr accordingly. Since control signal EQ1 is still retained at H level, the voltages on nodes Na, Nb fall from precharge voltage Vpr while being equalized.

Note that, although not shown in the figure, main bit lines MBL of the non-selected columns have been driven to precharge voltage Vpr by corresponding bit line drivers 35b. Therefore, no memory cell current will flow through the non-selected memory cells connected to the same strap as the selected memory cell.

At time T2, control signal EQ1 is set to L level, and the operation of equalizing the voltages on nodes Na, Nb is discontinued. In other words, nodes Na, Nb are electrically disconnected from precharge voltage Vpr. As a result, the voltage difference according to the difference between memory cell current Icell and reference current Iref appears between nodes Na, Nb. This voltage difference is amplified by N-channel MOS transistors 121, 122 serving as a cross-coupled amplifier.

At time T3, sense enable signal /SE is activated to L level. As a result, a constant current is supplied from power supply voltage Vcc to node Nd. Accordingly, the voltage difference between nodes Na, Nb is further amplified by P-channel MOS transistors 126, 127 serving as a cross-coupled amplifier.

At time T4, latch signal SL is set to L level. Accordingly, the voltages on nodes Na, Nb are latched in latch-type sense amplifier 85 at time T4. Latch-type sense amplifier 85 sets read data DOUT to either H level (power supply voltage Vcc) or L level (ground voltage GND) according to the latched voltage difference between nodes Na, Nb. The data is thus read from the selected memory cell.

At time T5, T6, word line WL, control signal REF, dummy word line DWL and column group selection signal GSL are inactivated to L level, and control signal EQ1, sense enable signal /SE and latch signal LS are again set to H level. As a result, input nodes Nia, Nib are disconnected from the outside, and nodes Na, Nb are again set to precharge voltage Vpr. As a result, the operation state returns to the state before time T1, that is, before data read operation.

Since control signal REF is inactivated after the data read operation, current consumption of reference current generator 151 can be reduced as in the case of reference current generator 150 in FIG. 13.

According to the modification of the second embodiment, data read operation can be conducted in the same manner as that of the second embodiment except that strap SL is driven to a positive voltage.

Moreover, since each data read circuit 120 is shared by a plurality of straps of the same memory cell row, the array area can be reduced.

Note that, in the modification of the second embodiment, data read circuit 100 in FIG. 13 may be used instead of data read circuit 120. In this case, the voltage level of column group selection signal GSL to be applied to selection gate BSG of FIG. 15 must be set appropriately. For example, column group selection signal GSL corresponding to the selected strap is set to ground voltage GND, whereas column group selection signal GSL corresponding to the non-selected straps is set to negative voltage Vnn.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
   a memory array including a plurality of memory cells arranged in a matrix and divided into a plurality of column groups along a column direction, each memory cell including a tunneling magneto-resistance element having an electric resistance varying according to storage data magnetically written therein;
   a plurality of first signal lines provided respectively corresponding to the memory cell columns; and
   a plurality of second signal lines provided respectively corresponding to said plurality of column groups in each memory cell row, wherein each tunneling magneto-resistance element is includes
a first magnetic layer electrically coupled between corresponding one of said plurality of first signal lines.
a second magnetic layer electrically coupled between corresponding one of said plurality of second signal lines, and
an insulating film interposed between said first and second magnetic layers and
said plurality of first signal lines and said plurality of second signal lines are arranged in two different directions, respectively.

2. A thin film magnetic memory device, comprising:
a memory array including a plurality of memory cells arranged in a matrix and divided into a plurality of column groups along a column direction, each memory cell including a tunneling magneto-resistance element having an electric resistance varying according to storage data magnetically written therein:
a plurality of first signal lines provided respectively corresponding to the memory cell columns: and
a plurality of second signal lines provided respectively corresponding to said plurality of column groups in each memory cell row, wherein
each tunneling magneto-resistance element is electrically coupled between corresponding one of said first signal lines and corresponding one of said second signal lines;
a plurality of word lines provided respectively corresponding to the memory cell rows and selectively activated according to a row selection result in data read operation; and
a plurality of access switches provided respectively corresponding to said plurality of second signal lines, wherein
each of said access switches is electrically coupled between corresponding one of second signal lines and a first voltage, and is turned ON in response to activation of corresponding one of said word lines.

3. The thin film magnetic memory device according to claim 2, further comprising:
a plurality of selection gates provided respectively corresponding to said plurality of second signal lines, and each connected in series with a corresponding one of said access switches between corresponding one of said second signal lines and said first voltage, wherein
each of said selection gates is turned OFF unless the corresponding second signal line is connected to a memory cell selected for data read operation.

4. The thin film magnetic memory device according to claim 2, wherein each of said access switches is provided in a region other than regions above and below said tunneling magneto-resistance element.

5. The thin film magnetic memory device according to claim 2, wherein
each said column group has L memory cell columns (where L is an integer of at least two),
said thin film magnetic memory device further comprising:
a selection circuit for selecting L first signal lines corresponding to a column group selected for data read operation from said plurality of first signal lines; and
L data read circuits for reading L storage data from L memory cells electrically coupled between said L first signal lines selected by said selection circuit and said first voltage in data read operation, respectively.

6. The thin film magnetic memory device according to claim 5, further comprising:
a signal line drive circuit for driving each of said selected L first signal lines to a second voltage, wherein
said L data read circuits read said L data according to currents respectively flowing through said selected L first signal lines.

7. A thin film magnetic memory device, comprising:
a memory array including a plurality of memory cells arranged in a matrix and divided into a plurality of column groups along a column direction, each memory cell including a tunneling magneto-resistance element having an electric resistance varying according to storage data magnetically written therein;
a plurality of first signal lines provided respectively corresponding to the memory cell columns; and
a plurality of second signal lines provided respectively corresponding to said plurality of column groups in each memory cell row, wherein
each tunneling magneto-resistance element is electrically coupled between corresponding one of said first signal lines and corresponding one of said second signal lines;
a plurality of word lines provided respectively corresponding to said memory cell rows and selectively activated according to a row selection result in data read operation;
a plurality of data read circuits provided respectively corresponding to said plurality of second signal lines;
a plurality of access switches provided respectively corresponding to said plurality of second signal lines, and each electrically coupled between corresponding one of said second signal lines and corresponding one of said data read circuits; and
a signal line drive circuit for driving the first signal line connected to a selected memory cell selected for data read operation to a first driving voltage, wherein
each access switch has a gate coupled to corresponding one of said word lines, and is selectively turned ON to electrically couple the second signal line connected to said selected memory cell to the corresponding data read circuit, and
each data read circuit drives with a second driving voltage the corresponding second signal line electrically coupled thereto through said turned-ON access switch, and reads said storage data according to a current flowing through the corresponding second signal line.

8. The thin film magnetic memory device according to claim 7, wherein said first driving voltage is a ground voltage and said second driving voltage is a negative voltage.

9. The thin film magnetic memory device according to claim 7, wherein said first driving voltage is a ground voltage and said second driving voltage is a positive voltage.

10. The thin film magnetic memory device according to claim 7, wherein
said plurality of data read circuits are arranged so that second signal lines of a same memory cell row share a same data read circuit,
said thin film magnetic memory device further comprising:
a plurality of selection gates provided respectively corresponding to said plurality of second signal lines, and each connected in series with corresponding one of said access switches between corresponding one of said second signal lines and corresponding one of said data read circuits, wherein
- each of said access switches is turned ON in response to activation of the corresponding word line, and
- each selection gate is turned OFF unless the corresponding second signal line is connected to a memory cell selected for data read operation.

11. The thin film magnetic memory device according to claim 7, wherein each of said access switches is provided in a region other than regions above and below said tunneling magneto-resistance element.

12. A thin film magnetic memory device, comprising:
a plurality of memory cells for storing storage data that is set to either a first or second level, wherein
- each memory cell includes a tunneling magneto-resistance element having either a first or second electric resistance according to the level of said storage data magnetically written therein, and
- a selected memory cell selected from said plurality of memory cells for data read operation is electrically coupled between first and second voltages, said thin film magnetic memory device further comprising:
- a reference current generator for generating a reference current equal to an intermediate value of first and second currents, said first current being a current that flows through said selected memory cell when said storage data is at said first level, and said second current being a current that flows through said selected memory cell when said storage data is at said second level; and
- a data read circuit for reading said storage data based on comparison between a memory cell current flowing through said selected memory cell and said reference current.

13. The thin film magnetic memory device according to claim 12, wherein
said reference current generator includes
- first and second dummy magneto-resistance elements electrically coupled in parallel between said first and second voltages, and
- a current converter for outputting an average value of currents respectively flowing through said first and second dummy magneto-resistance elements as said reference current,
each of said first and second dummy magneto-resistance elements has same characteristics as those of said tunneling magneto-resistance element, and
said first and second dummy magneto-resistance elements store said storage data of said first and second levels, respectively.

14. The thin film magnetic memory device according to claim 12, further comprising:
- a bit line provided for every prescribed region of said plurality of memory cells;
- a bit line driving portion for driving the bit line corresponding to said selected memory cell to said first voltage;
- an access portion for electrically coupling said selected memory cell between the bit line corresponding to said selected memory cell and said second voltage; and
- a current detector having an internal node connected to the bit line corresponding to said selected memory cell, for producing a detection current according to said memory cell current, wherein
said data read circuit reads said storage data based on comparison between said detection current from said current detector and said reference current from said reference current generator.

15. The thin film magnetic memory device according to claim 14, wherein
said data read circuit includes
- a first switch portion provided between said current detector and a first input node, and turned ON at a first time corresponding to a timing said access portion is turned ON,
- a second switch portion provided between said reference current generator and a second input node, and turned ON at said first time,
- an equalizing portion for electrically coupling first and second nodes to said second voltage during a period between a time before said data read operation is started and a second time later than said first time, and electrically disconnecting said first and second nodes from said second voltage from said second time,
- a current sensing portion for generating between said first and second nodes a voltage difference according to a current difference between said first and second input nodes, and
- a sense amplifier for reading said storage data according to said voltage difference between said first and second nodes at a third time later than said second time.

16. The thin film magnetic memory device according to claim 12, further comprising:
- a bit line provided for every prescribed region of said plurality of memory cells;
- a bit line driving portion provided for driving the bit line corresponding to said selected memory cell to said first voltage; and
- an access portion for electrically coupling said selected memory cell between the bit line corresponding to said selected memory cell and a first input node, wherein
said data read circuit includes a driving portion for electrically coupling said first input node to said second voltage at least for a prescribed period after data read operation is started.

17. The thin film magnetic memory device according to claim 16, wherein
said data read circuit further includes a current sensing portion for generating between first and second nodes a voltage difference according to a current difference between said first input node and a second input node receiving said reference current from said reference current generator,
said current sensing portion includes
- a first transistor, provided between said first input node and said first node, for forming a current path according to a voltage of said second node, and
- a second transistor provided between said second input node and said second node, for forming a current path according to a voltage of said first node,
said driving portion includes an equalizing portion for electrically coupling first and second nodes to said second voltage during a period between a time before said data read operation is started and a second time later than a first time corresponding to a timing said access portion is turned ON, and electrically disconnecting said first and second nodes from said second voltage from said second time, and said data read circuit further includes a sense amplifier for reading said storage data according to said voltage difference between said first and second nodes at a third time later than said second time.

18. The thin film magnetic memory device according to claim 17, wherein said first input node is a node common to a plurality of memory cells respectively corresponding to different bit lines, and said bit line driving portion drives the bit line that is not coupled to said selected memory cell to said second voltage.

19. The thin film magnetic memory device according to claim 16, wherein said first voltage is a ground voltage, said second voltage is a negative voltage, said data read circuit further includes a first equalizing portion for electrically coupling a first input node and a second input node receiving said reference current from said reference current generator to said first voltage during a period between a time before said data read operation is started and a first time after said data read operation is started, and electrically disconnecting said first and second input nodes from said first voltage from said first time, and a current sensing portion for generating between first and second nodes a voltage difference according to a current difference between said first and second input nodes from said first time, said current sensing portion includes a first transistor provided between said first input node and said first node, for forming a current path according to a voltage of said second node from said first time, and a second transistor provided between said second input node and said second node, for forming a current path according to a voltage of said first node from said first time, said driving portion includes a second equalizing portion for electrically coupling said first and second nodes to said second voltage during a period between a time before said data read operation is started and a second time later than said first time, and electrically disconnecting said first and second nodes from said second voltage from said second time, and said data read circuit further includes a sense amplifier for reading said storage data according to said voltage difference between said first and second nodes at a third time later than said second time.

20. The thin film magnetic memory device according to claim 19, wherein said first input node is a node common to a plurality of memory cells respectively corresponding to different bit lines, and said bit line driving portion drives a bit line that is not coupled to said selected memory cell to said second voltage.

* * * * *